US009437616B2

(12) United States Patent
Tada

(10) Patent No.: US 9,437,616 B2
(45) Date of Patent: Sep. 6, 2016

(54) DISPLAY APPARATUS

(71) Applicant: Sharp Kabushiki Kaisha, Osaka (JP)

(72) Inventor: Kenshi Tada, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/646,379

(22) PCT Filed: Nov. 15, 2013

(86) PCT No.: PCT/JP2013/006724
§ 371 (c)(1),
(2) Date: May 20, 2015

(87) PCT Pub. No.: WO2014/080604
PCT Pub. Date: May 30, 2014

(65) Prior Publication Data
US 2015/0303219 A1    Oct. 22, 2015

(30) Foreign Application Priority Data

Nov. 22, 2012 (JP) ................. 2012-256069

(51) Int. Cl.
*G02F 1/1345* (2006.01)
*H01L 27/12* (2006.01)
*G02F 1/1362* (2006.01)
*G02F 1/1368* (2006.01)

(52) U.S. Cl.
CPC ......... *H01L 27/1218* (2013.01); *G02F 1/1368* (2013.01); *G02F 1/13452* (2013.01); *G02F 1/13454* (2013.01); *G02F 1/136286* (2013.01); *H01L 27/124* (2013.01); *H01L 27/1214* (2013.01)

(58) Field of Classification Search
CPC .......... G02F 1/136286; G02F 1/1368; G02F 1/13452; G02F 1/13454; H01L 27/1218; H01L 27/1214; H01L 27/124
USPC ........................................................ 349/150
See application file for complete search history.

(56) References Cited

U.S. PATENT DOCUMENTS

| | | | | |
|---|---|---|---|---|
| 5,668,700 A | * | 9/1997 | Tagusa ................ | H01L 23/5387 257/E21.516 |
| 5,959,709 A | * | 9/1999 | Asada ................. | G02F 1/13452 349/150 |
| 6,407,795 B1 | * | 6/2002 | Kamizono .......... | G02F 1/13452 349/149 |
| 7,557,451 B2 | * | 7/2009 | Shinojima .......... | G02F 1/13452 174/260 |
| 2002/0071082 A1 | | 6/2002 | Okita et al. | |
| 2013/0200409 A1 | | 8/2013 | Abe | |

FOREIGN PATENT DOCUMENTS

| | | |
|---|---|---|
| JP | 2002-82627 A | 3/2002 |
| JP | 2005-338179 A | 12/2005 |
| JP | 2013-160942 A | 8/2013 |

* cited by examiner

*Primary Examiner* — James Dudek
(74) *Attorney, Agent, or Firm* — Chen Yoshimura LLP

(57) ABSTRACT

A liquid crystal display device includes: a TFT substrate that includes gate lines; and a driver circuit section that includes a gate driver that is connected to the gate lines. A frame region includes a wiring substrate that sandwiches the gate lines. The wiring substrate includes: a first wiring substrate that has first wiring lines that are connected to the gate lines; a second wiring substrate that has second wiring lines that are connected to the first wiring lines; and a third wiring substrate that is attached to the second wiring substrate and has third wiring lines that are connected to the second wiring lines and a gate driver.

13 Claims, 18 Drawing Sheets

(a)

(b)

(c)

DISPLAY APPARATUS

TECHNICAL FIELD

The present invention relates to a display device such as a liquid crystal display device that is provided with plastic substrates.

BACKGROUND ART

In recent years, display devices that employ plastic substrates rather than glass substrates have attracted a large amount of attention in the display technology industry due to major advantages such as improved flexibility, better shock-resistance, and lighter weight. These plastic substrate displays offer possibilities for creation of new types of display devices that could not previously be constructed using glass substrate displays.

Patent Document 1 discloses one example of such a display device. This liquid crystal display device includes a pair of substrates that face each other (a thin film transistor (TFT) substrate and a color filter substrate) and a liquid crystal layer sandwiched between the pair of substrates. The TFT substrate includes: a flexible plastic substrate made from a polyimide resin or the like; and driver circuits (gate drivers and source drivers, for example) that are connected to wiring lines for driving the display (gate lines and source lines, for example) via lead-out wiring lines formed on the plastic substrate.

RELATED ART DOCUMENTS

Patent Documents

Patent Document 1: Japanese Patent Application Laid-Open Publication No. 2005-338179
Patent Document 2: Japanese Patent Application Laid-Open Publication No. 2002-82627

SUMMARY OF THE INVENTION

Problems to be Solved by the Invention

However, in the display device disclosed in Patent Document 1, the lead-out wiring lines that are connected to the driver circuits are formed in a frame region formed around the display region. This results in an undue increase in the area of the frame region and makes the device unsuitable for miniaturization.

The present invention was made in view of such problems and aims to provide a flexible display device in which an undue increase in the area of the frame region due to the lead-out wiring lines can be prevented, thereby facilitating miniaturization of the device.

Means for Solving the Problems

In order to achieve the abovementioned goals, a display device of the present invention includes: a display device substrate that is a flexible plastic substrate having driver wiring lines formed thereon, a display region for displaying an image, and a frame region along a periphery of the display region; and a driver circuit unit that is adjacent to the display region and the frame region and that has a driver circuit connected to the driver wiring lines; wherein the driver wiring lines are drawn out from the display region to the frame region, wherein the frame region has a wiring substrate on the display device substrate sandwiching the driver wiring lines that are drawn out on the frame region, wherein the wiring substrate is formed of: a first wiring substrate that is provided on a side of the display device substrate facing the driver wiring lines and that has first wiring lines connected to the driver wiring lines drawn out on the frame region; a second wiring substrate that is provided on a side opposite to the side of the display device substrate facing the driver wiring lines and that has second wiring lines connected to the first wiring lines; and a third wiring substrate that is attached to the second wiring substrate and that has third wiring lines connected to the second wiring lines and the driver circuit, wherein the first to third wiring substrates are other flexible plastic substrates, and wherein the driver circuit is connected to the driver wiring lines via the first to third wiring lines.

Effects of the Invention

The present invention makes it possible to provide a flexible display device in which an undue increase in the area of the frame region can be prevented, thereby facilitating miniaturization of the device.

DETAILED DESCRIPTION OF EMBODIMENTS

Embodiments of the present invention will be described in detail below with reference to figures. In these embodiments, a liquid crystal display device is used for the display device as an example.

Embodiment 1

Figure 1:
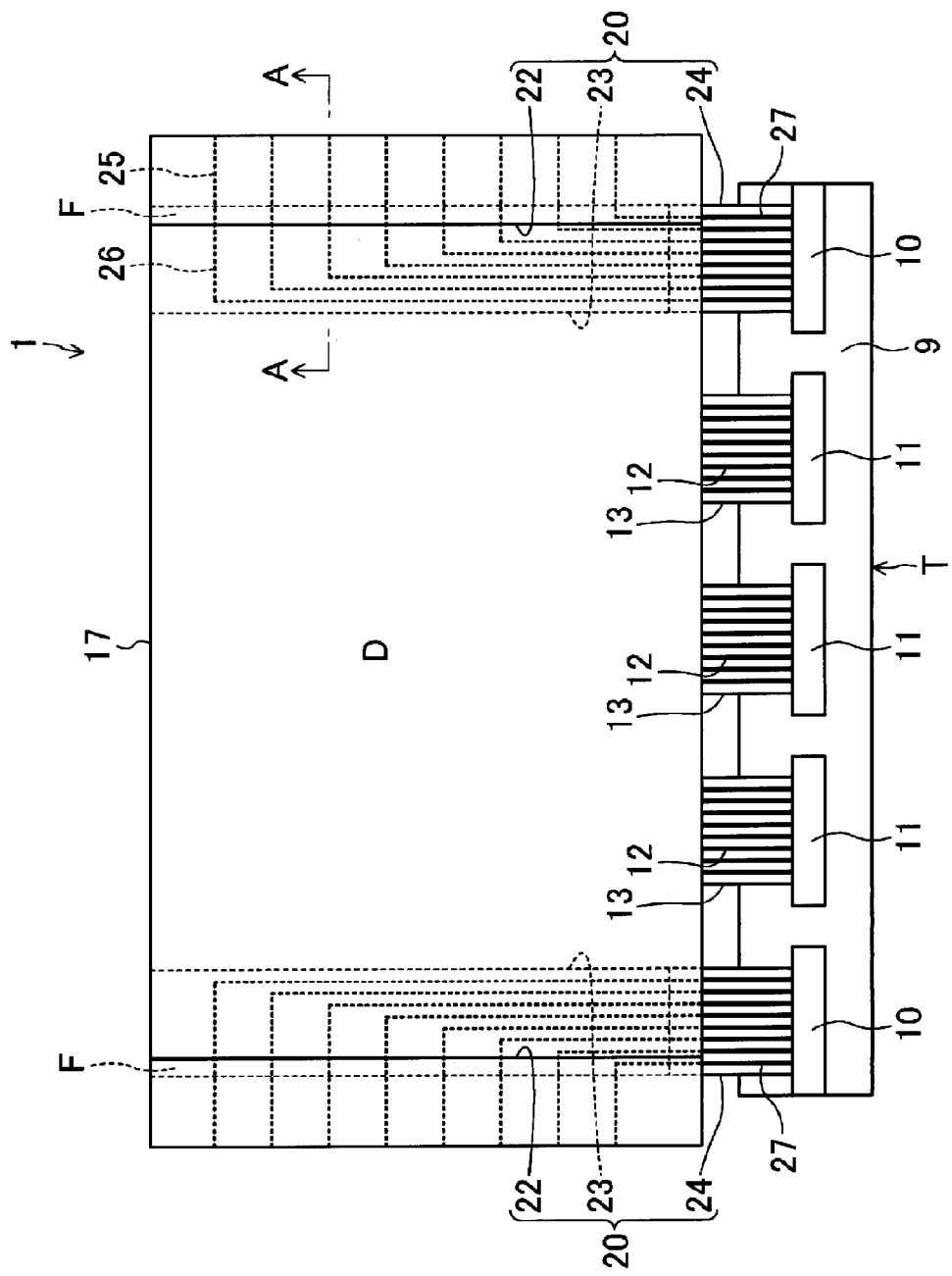
FIG. 1 is a plan view illustrating a liquid crystal display device according to Embodiment 1 of the present invention.
Figure 2:
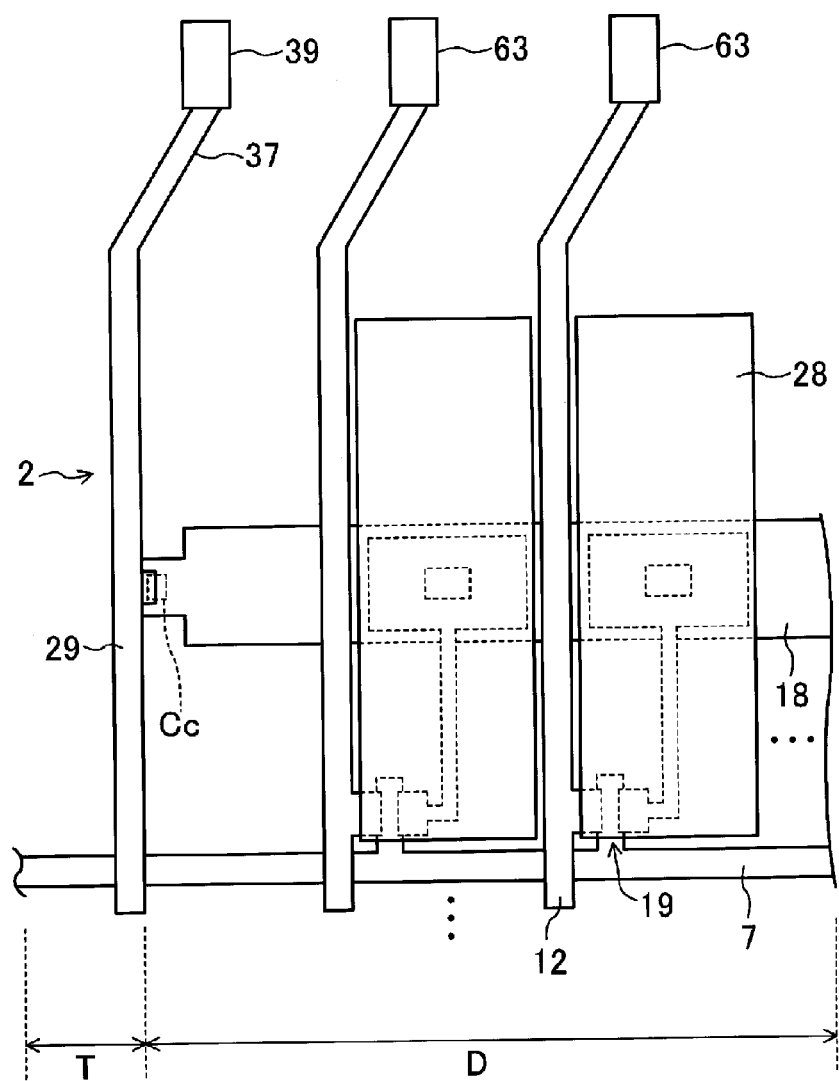
FIG. 2 is a plan view illustrating a TFT substrate of the liquid crystal display device according to Embodiment 1 of the present invention.
Figure 3:
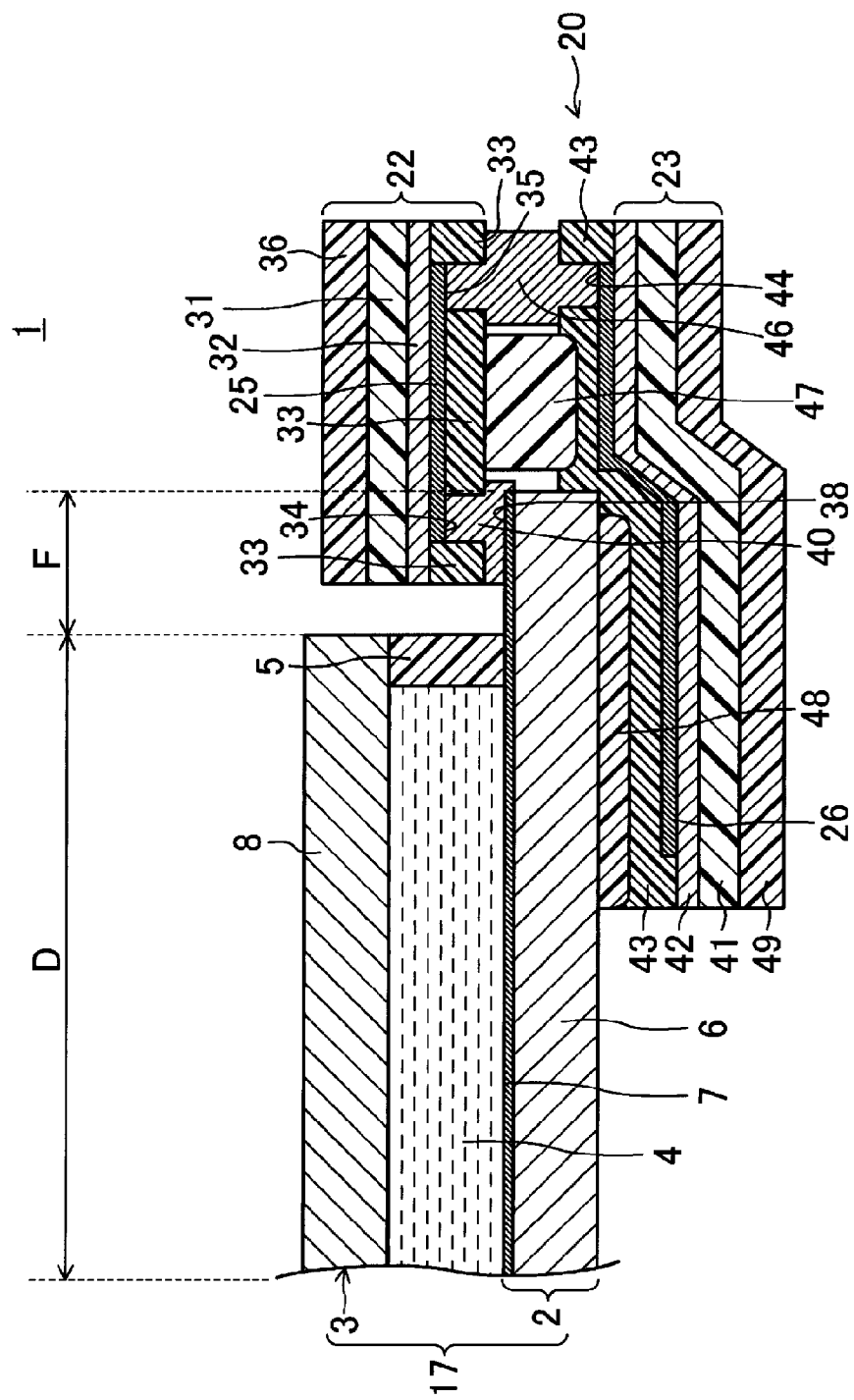
FIG. 3 is a cross-sectional view of the liquid crystal display device according to Embodiment 1 of the present invention taken along line A-A in FIG. 1.
Figure 4:
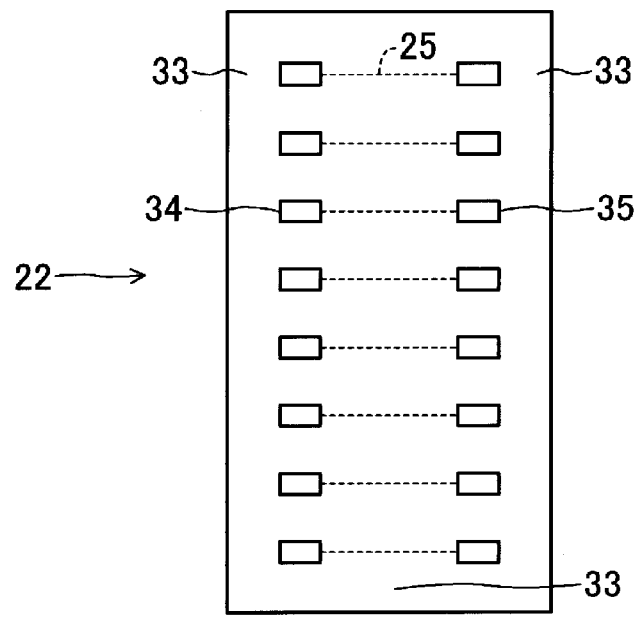
FIG. 4 is a plan view illustrating a first wiring substrate of the liquid crystal display device according to Embodiment 1 of the present invention.
Figure 5:
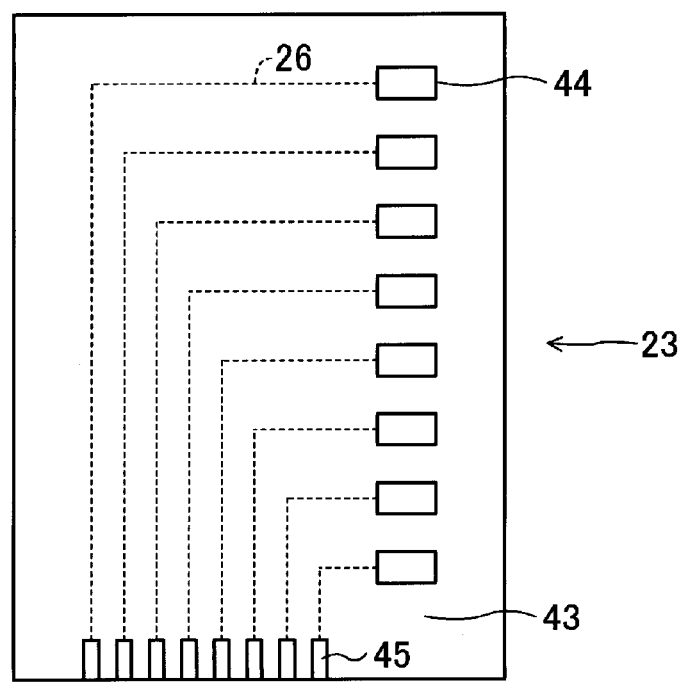
FIG. 5 is a plan view illustrating a second wiring substrate of the liquid crystal display device according to Embodiment 1 of the present invention.
Figure 6:
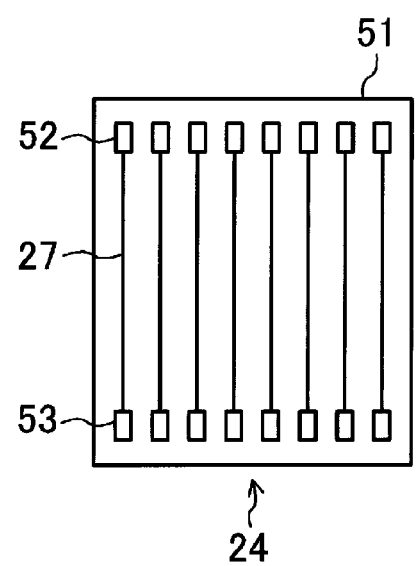
FIG. 6 is a plan view illustrating a third wiring substrate of the liquid crystal display device according to Embodiment 1 of the present invention.
Figure 7:
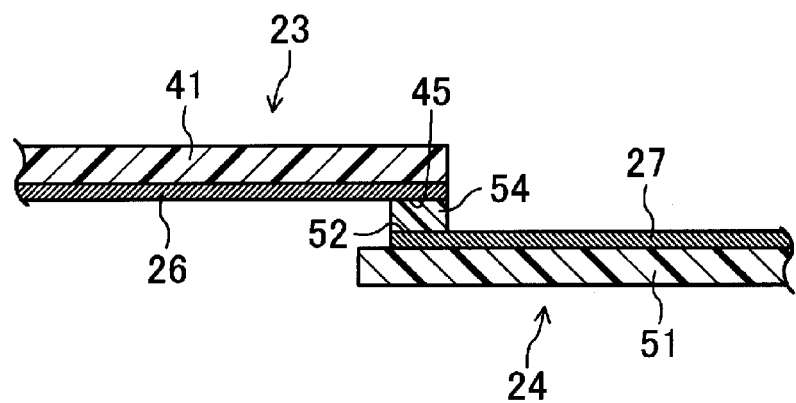
FIG. 7 is a cross-sectional view illustrating how the second wiring substrate and the third wiring substrate are fixed together in the liquid crystal display device according to Embodiment 1 of the present invention.
Figure 8:
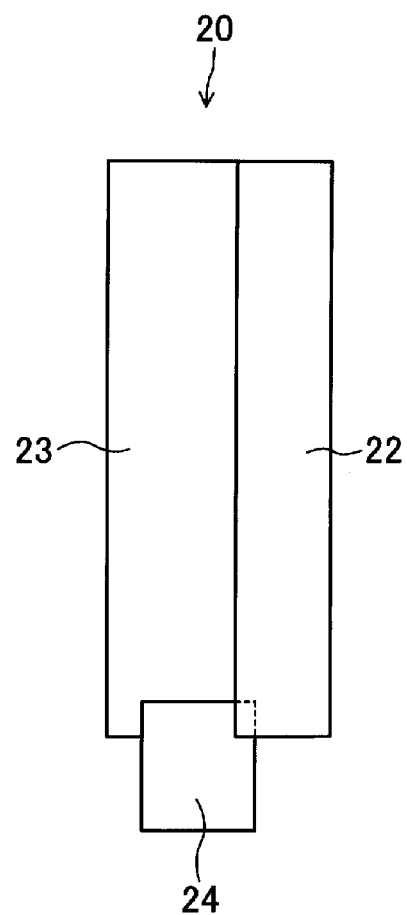
FIG. 8 is a plan view illustrating a wiring substrate of the liquid crystal display device according to Embodiment 1 of the present invention.

FIG. 1 is a plan view illustrating a liquid crystal display device according to Embodiment 1 of the present invention. FIG. 2 is a plan view illustrating a TFT substrate of the liquid crystal display device according to Embodiment 1 of the present invention. Moreover, FIG. 3 is a cross-sectional view of the liquid crystal display device according to Embodiment 1 of the present invention taken along line A-A in FIG. 1. Moreover, FIG. 4 is a plan view illustrating a first wiring substrate of the liquid crystal display device according to Embodiment 1 of the present invention. FIG. 5 is a plan view illustrating a second wiring substrate of the liquid crystal display device according to Embodiment 1 of the present invention. Moreover, FIG. 6 is a plan view illustrating a third wiring substrate of the liquid crystal display device according to Embodiment 1 of the present invention. FIG. 7 is a cross-sectional view illustrating how the second wiring substrate and the third wiring substrate are fixed together in the liquid crystal display device according to Embodiment 1 of the present invention. Moreover, FIG. 8 is a plan view illustrating a wiring substrate of the liquid crystal display device according to Embodiment 1 of the present invention.

As shown in FIGS. 1 and 3, a liquid crystal display device 1 includes: a TFT substrate 2 (a display device substrate) in which a plurality of thin-film transistors (TFTs) are formed as switching elements; and a color filter substrate 3 (another display device substrate; an opposing substrate) that is arranged facing the TFT substrate 2. Moreover, the liquid crystal display device 1 also includes a liquid crystal display panel 17 that includes: a liquid crystal layer 4 that serves as the display medium layer and is sandwiched between the TFT substrate 2 and the color filter substrate 3; and a sealing material 5 that is also sandwiched between the TFT substrate 2 and the color filter substrate 3 and is formed in a frame shape to fix the TFT substrate 2 and the color filter substrate 3 to one another as well as to seal the liquid crystal layer 4 within the liquid crystal display panel 17.

This sealing material 5 is formed around the periphery of the liquid crystal layer 4 and fixes the TFT substrate 2 and the color filter substrate 3 to one another. Moreover, the TFT substrate 2 and the color filter substrate 3 each have a rectangular plate shape.

Moreover, as shown in FIGS. 1 and 3, in the liquid crystal display device 1, the regions of the TFT substrate 2 and the color filter substrate 3 that overlap within the region defined by the sealing material 5 define a display region D for displaying images. In the display region D, a plurality of pixels (the minimum units of an image) are arranged in a matrix pattern.

Moreover, as shown in FIGS. 1 and 3, the liquid crystal display device 1 includes frame regions F (non-display regions that are not involved in displaying images) formed around the display region D. As shown in FIG. 3, these frame regions F are defined by the portion of the TFT substrate 2 that extends beyond the corresponding edge of the color filter substrate 3.

Moreover, as shown in FIG. 1, the liquid crystal display device 1 includes a driver circuit section T arranged adjacent to the display region D and the frame regions F.

The TFT substrate 2 includes a film-shaped flexible plastic substrate 6 made from a resin material. A material such as a polyimide resin or an acrylic resin can be used as the resin material for the plastic substrate 6, for example.

Moreover, a display element layer provided with TFTs or the like is formed on the plastic substrate 6 of the TFT substrate 2. As shown in FIG. 2, this display element layer includes, in the display region D: a plurality of mutually parallel gate lines 7 formed on the plastic substrate 6; a plurality of mutually parallel auxiliary capacitance lines 18 formed between the gate lines 7; and a plurality of mutually parallel source lines 12 that intersect with the gate lines 7. Moreover, the display element layer includes: a plurality of TFTs 19, one formed at each intersection between the gate lines 7 and the source lines 12 (that is, one TFT is formed for each pixel); an interlayer insulating film (not shown in the figures) formed to cover the TFTs 19; a planarizing film (not shown in the figures) formed to cover the interlayer insulating film; a plurality of pixel electrodes 28 formed in a matrix pattern on the planarizing film and each connected to one of the TFTs 19; and an alignment film (not shown in the figures) formed to cover the pixel electrodes 28.

As shown in FIG. 2, each auxiliary capacitance line 18 is connected to an auxiliary capacitance terminal 39 via another auxiliary capacitance line 29 (a lead-out wiring line) and a relay line 37. Here, the auxiliary capacitance line 29 is connected to the auxiliary capacitance line 18 via a contact hole Cc formed in a gate insulation film. Moreover, the auxiliary capacitance terminal 39 is, for example, connected to a driver circuit of the driver circuit section T such as an inversion driver circuit (not shown in the figures) for the auxiliary capacitance lines.

As shown in FIGS. 2 and 3, the gate lines 7 are drawn out from the display region D into the frame region F. Moreover, the auxiliary capacitance line 29 is arranged orthogonal to the auxiliary capacitance lines 18 in the frame region F. Moreover, the auxiliary capacitance terminal 39 is provided within the abovementioned driver circuit section T.

As shown in FIG. 2, the source lines 12 are connected to source line terminals 63, and the source line terminals 63 are provided within the abovementioned driver circuit section T.

Like the TFT substrate 2, the color filter substrate 3 includes a film-shaped flexible plastic substrate 8 made from a resin material. The same types of organic resin materials used to form the abovementioned plastic substrate 6 can be used as the resin material for the plastic substrate 8.

Moreover, a color filter element layer is formed on the plastic substrate 8 of the color filter substrate 3. This color filter element layer includes: a color filter that includes a plurality of colored layers (not shown in the figures) that are colored red, green, and blue and each correspond to one of the pixel electrodes on the TFT substrate 2, as well as a black matrix (not shown in the figures) formed between the colored layers; an overcoat layer (not shown in the figures) formed on top of the color filter; a common electrode (not shown in the figures) formed on top of the overcoat layer; and an alignment film (not shown in the figures) formed on top of the common electrode.

Moreover, it is preferable that the thicknesses of the plastic substrates 6 and 8 be 1-50 μm. This is because the plastic substrates 6 and 8 lack sufficient mechanical strength when less than 1 μm in thickness. Moreover, when greater than 50 μm in thickness, the plastic substrates 6 and 8 become more prone to warping, which can cause problems during the processes for forming the display element layer and the color filter element layer.

The liquid crystal layer 4 contains a nematic liquid crystal material that exhibits certain electro-optical properties, for example.

Moreover, a polarizing plate (not shown in the figures) is provided on the outer (rear) surface of the TFT substrate 2, and a backlight unit (not shown in the figures) is provided on the rear side of the polarizing plate. Moreover, a polarizing plate (not shown in the figures) is provided on the outer (front) surface of the color filter substrate 3.

Moreover, as shown in FIG. 1, the driver circuit section T includes a driver circuit board 9 as well as gate drivers 10 and source drivers 11 that serve as driver circuits. It should be noted that the gate drivers 10 and the source drivers 11 are provided on the driver circuit board 9.

Moreover, as shown in FIG. 1, the source lines 12 formed in the display region D are formed on a plastic substrate 13 made from a polyimide resin or the like and extend into the driver circuit section T. The source lines 12 are connected to the source drivers 11 in the driver circuit section T via the abovementioned source line terminals 63.

In the present embodiment, as shown in FIGS. 1 to 3, the gate lines 7 are drawn out from the display region D into the frame regions F. Wiring substrates 20 are provided in the frame regions F and sandwich the gate lines 7 that are drawn out thereinto.

More specifically, each wiring substrate 20 includes: a first wiring substrate 22 that is provided on the gate line 7 side of the TFT substrate 2 and has first wiring lines 25 that are connected to the gate lines 7 that are drawn out into the frame region F; a second wiring substrate 23 that is arranged on the side of the TFT substrate 2 opposite to the gate line 7 side and has second wiring lines 26 that are connected to the first wiring lines 25; and a third wiring substrate 24 that is attached to the second wiring substrate 23 and has third wiring lines 27 that are connected to the second wiring lines 26 and the corresponding gate driver 10.

Furthermore, the gate drivers 10 are connected to the gate lines 7 via the first wiring lines 25, the second wiring lines 26, and the third wiring lines 27.

Furthermore, in the present embodiment, the gate lines 7 that are drawn out into the frame region F are sandwiched between the first wiring substrate 22 and the second wiring substrate 23. Moreover, of the first wiring lines 25, the second wiring lines 26, and the third wiring lines 27, the wiring lines that are equivalent to the abovementioned conventional lead-out wiring lines (that is, the second wiring lines 26) are arranged on the rear side of the TFT substrate 2 (that is, on the side opposite to the gate line 7 side of the TFT substrate 2). As a result, as shown in FIG. 1, a portion of the second wiring substrate 23 on which the second wiring lines 26 are formed overlaps with the display region D when viewed in a plan view.

Providing the liquid crystal display device 1 with these wiring substrates 20 prevents an undue increase in the area of the frame regions F and facilitates miniaturization the liquid crystal display device 1.

As shown in FIGS. 3 and 4, the first wiring substrate 22 includes: a film-shaped flexible plastic substrate 31 made from a resin material such as a polyimide resin; and a moisture-resistant protective layer 32 formed on the plastic substrate 31. Moreover, the first wiring substrate 22 includes: the first wiring lines 25 that are formed on the protective layer 32 and are connected to the gate lines 7 and the second wiring lines 26; and a resin layer 33 formed on top of both the protective layer 32 and the first wiring lines 25.

Moreover, examples of materials for the protective layer 32 include inorganic materials such as a silicon nitride film, a silicon oxide film, a silicon oxynitride film, or a silicon nitride oxide film, for example. Moreover, in order to achieve sufficient moisture-resistance without an undue increase in thickness of the protective layer 32, it is preferable that the thickness of the protective layer 32 be 0.1 μm to 1.0 μm. Moreover, examples of materials for the resin layer 33 include organic materials such as acrylic resins, for example. It is preferable that the thickness of the resin layer 33 be 1.0 μm to 10 μm.

Moreover, as shown in FIGS. 3 and 4, connection terminals 34 and 35 are formed on the ends of the first wiring lines 25. The first wiring substrate 22 is fixed to the TFT substrate 2 via a conductive adhesive layer 40. The conductive adhesive layer 40 also electrically connects the connection terminals 34 to connection terminals 38 formed on the ends of the gate lines 7, thereby electrically connecting the first wiring lines 25 to the gate lines 7.

The material used for this conductive adhesive layer 40 is not particularly limited as long as the material is conductive and has sufficient adhesive strength to fix the TFT substrate 2 and the first wiring substrate 22 to one another. An adhesive film or the like can be used for the conductive adhesive layer 40, for example.

An anisotropic conductive adhesive that contains conductive particles can be used for such an adhesive film. An anisotropic conductive film can be used for this anisotropic conductive adhesive, for example.

Moreover, as shown in FIG. 3, a protective film 36 for protecting the plastic substrate 31 is formed on the outer surface thereof (that is, on the surface opposite to the side on which the first wiring lines 25 are disposed). A polyimide resin or the like can be used for this protective film 36, for example.

As shown in FIGS. 3 and 5, the second wiring substrate 23 includes: a film-shaped flexible plastic substrate 41 made from a resin material such as a polyimide resin; and a moisture-resistant protective layer 42 formed on the plastic substrate 41. Moreover, the second wiring substrate 23 includes: the second wiring lines 26 that are formed on the protective layer 42 and are connected to the first wiring lines 25 and the third wiring lines 27; and a resin layer 43 formed on top of both the protective layer 42 and the second wiring lines 26. The same types of materials that can be used for the protective layer 32 can be used for the protective layer 42, and the same types of materials that can be used for the resin layer 33 can be used for the resin layer 43.

Moreover, as shown in FIGS. 3 and 5, connection terminals 44 and 45 are formed on the ends of the second wiring lines 26. The second wiring substrate 23 is fixed to the first wiring substrate 22 via a conductive adhesive layer 46. The conductive adhesive layer 46 also electrically connects the connection terminals 35 of the first wiring substrate 22 to the connection terminals 44 of the second wiring substrate 23, thereby electrically connecting the first wiring lines 25 to the second wiring lines 26.

The same material used for the conductive adhesive layer 40 can be used for the conductive adhesive layer 46.

Moreover, as shown in FIG. 3, each wiring substrate 20 includes an adhesive layer 47 that is sandwiched between the resin layer 33 of the first wiring substrate 22 and the resin layer 43 of the second wiring substrate 23. This adhesive layer 47 fixes the first wiring substrate 22 and the second wiring substrate 23 to one another.

The adhesive layer 47 is formed using a thermosetting resin such as an epoxy resin, and the adhesive layer 47 fixes the first wiring substrate 22 and the second wiring substrate 23 to one another.

Moreover, as shown in FIG. 3, each wiring substrate 20 includes an adhesive layer 48 that is sandwiched between the plastic substrate 6 of the TFT substrate 2 and the resin layer 43 of the second wiring substrate 23. This adhesive layer 48 fixes the plastic substrate 6 and the second wiring substrate 23 to one another.

The adhesive layer 48 is formed using the abovementioned thermosetting resin such as an epoxy resin, and the adhesive layer 48 fixes the TFT substrate 2 and the second wiring substrate 23 to one another.

Moreover, as shown in FIG. 3, a protective film 49 for protecting the plastic substrate 41 is formed on the outer surface thereof (that is, on the surface opposite to the side on which the second wiring lines 26 are disposed). A polyimide resin or the like can be used for this protective film 49, for example.

As shown in FIG. 6, the third wiring substrate 24 includes: a film-shaped flexible plastic substrate 51 made from a resin material such as a polyimide resin; and the third wiring lines 27 that are formed on the plastic substrate 51 and are connected to the second wiring lines 26 and the corresponding gate driver 10.

Moreover, as shown in FIG. 6, connection terminals 52 and 53 are formed on the ends of the third wiring lines 27. As shown in FIG. 7, the third wiring substrate 24 is fixed to the second wiring substrate 23 via a conductive adhesive layer 54. The conductive adhesive layer 54 also electrically connects the connection terminals 45 of the second wiring substrate 26 to the connection terminals 52 of the third wiring substrate 24, thereby electrically connecting the second wiring lines 26 to the third wiring lines 27.

The same material used for the conductive adhesive layer 40 can be used for the conductive adhesive layer 54.

Moreover, the connection terminals 53 of the third wiring lines 27 are connected to connection terminals of the gate driver 10 (not shown in the figures), thereby electrically connecting the third wiring lines 27 to the corresponding gate driver 10.

Furthermore, in the present embodiment the gate drivers 10 are connected to the gate lines 7 via the first wiring lines 25, the second wiring lines 26, and the third wiring lines 27.

FIG. 8 is a plan view of the wiring substrate 20, which is configured by fixing the first wiring substrate 22 and the third wiring substrate 24 to the second wiring substrate 23.

In the present embodiment, the first wiring substrate 22 includes the plastic substrate 31, the second wiring substrate 23 includes the plastic substrate 41, and the third wiring substrate 24 includes the plastic substrate 51. The liquid crystal display device 1 includes the flexible TFT substrate 2, the flexible color filter substrate 3, and the flexible first to third wiring substrates 22 to 24. Therefore, the overall display device is flexible.

Moreover, the plastic substrates 6, 8, 31, 41, and 51 are made from organic materials such as polyimide resins or acrylic resins. This makes it possible to produce the plastic substrates 6, 8, 31, 41, and 51 using low-cost, general-purpose resin materials.

Figure 9:
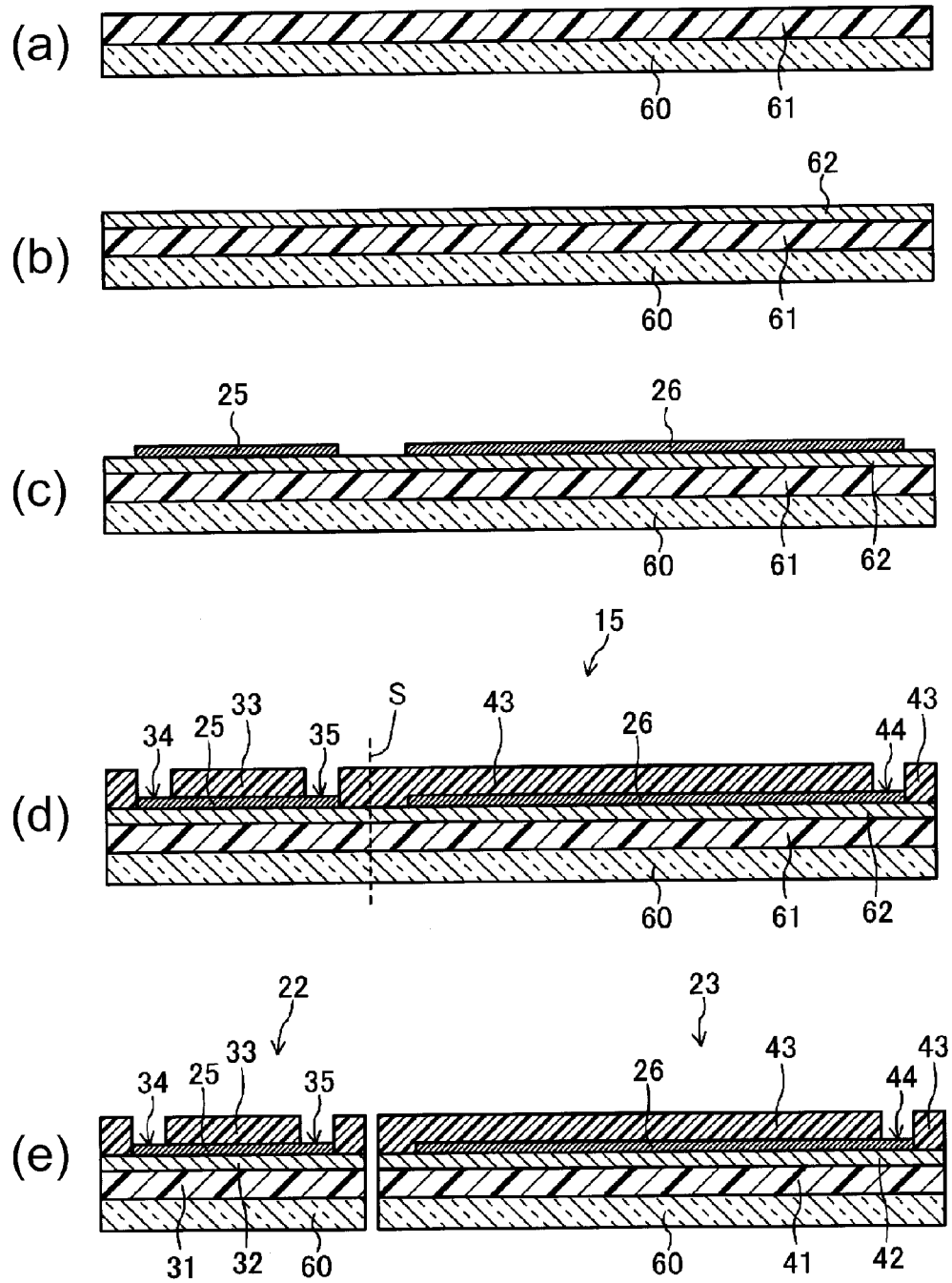
FIG. 9 includes several cross-sectional views for explaining a method for manufacturing the wiring substrates according to Embodiment 1 of the present invention.
Figure 10:
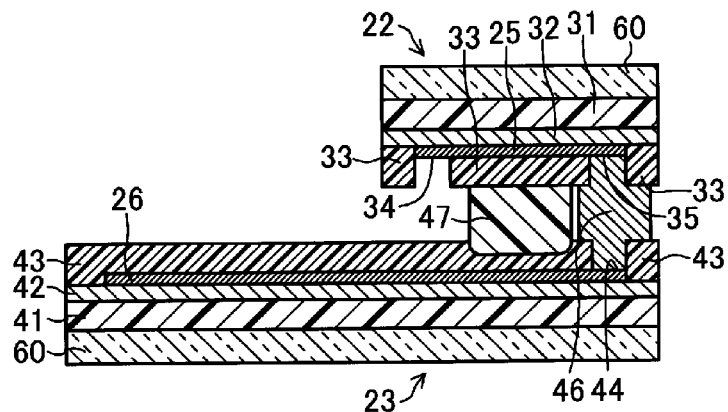
FIG. 10 includes several cross-sectional views for explaining the method for manufacturing the wiring substrates according to Embodiment 1 of the present invention.
Figure 10:
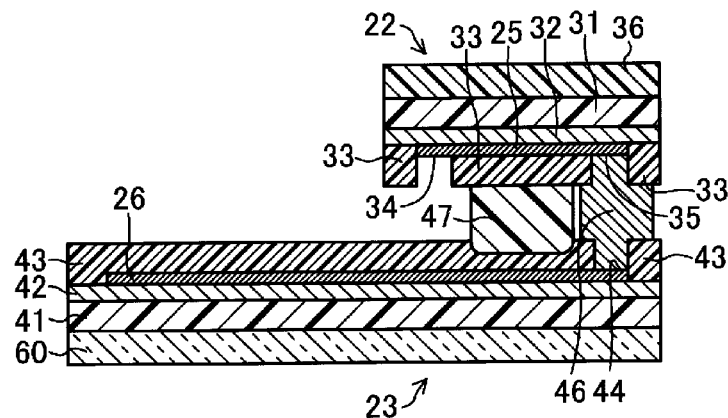
Figure 10:
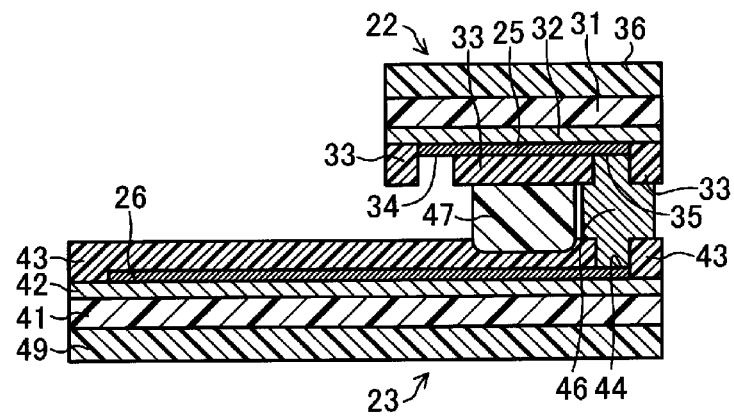

Next, a method for manufacturing the wiring substrates and the liquid crystal display device of the present embodiment will be described. FIGS. 9 and 10 include several cross-sectional views for explaining the method for manufacturing the wiring substrates according to Embodiment 1 of the present invention. It should be noted that the method described below is only an example. The liquid crystal display device of the present invention is not limited to being manufactured using the method described below.

<Wiring Substrate Formation Process>

The process for forming the wiring substrates of the present embodiment includes: a plastic substrate formation step, a protective layer formation step, a wiring line formation step, a resin layer formation step, a division step, a step for fixing the first wiring substrate and the second wiring substrate together, and a glass substrate detachment step. The details of each step will be described below.

(Plastic Substrate Formation Step)

First, as shown in FIG. 9(a), a glass substrate 60 that is 0.7 mm in thickness, for example, is prepared as a supporting substrate.

Next, as shown in FIG. 9(a), a film-shaped flexible plastic substrate 61 with a thickness of 1-50 µm is formed on the glass substrate 60 using a polyimide resin, for example.

(Protective Layer Formation Step)

Next, as shown in FIG. 9(b), a protective layer 62 with a thickness of 0.1-1.0 µm is formed on the plastic substrate 61 using a material such as $SiO_2$ or SiON. This protective layer 62 is layered onto the surface of the plastic substrate 61 using an inorganic material such as $SiO_2$ or SiON and a method such as vapor deposition, sputtering, or chemical vapor deposition, for example.

(Wiring Line Formation Step)

Next, as shown in FIG. 9(c), a film such as an aluminum film, a copper film, a silver film, a molybdenum film, a tungsten film, or a titanium film is formed over the entire protective layer 62 using a sputtering method, for example. This film is then patterned using photolithography to form the first wiring lines 25 and the second wiring lines 26 with a thickness of 400 Å on the protective layer 62.

(Resin Layer Formation Step)

Next, as shown in FIG. 9(d), an acrylic resin film (with a thickness of 1-10 µm), for example, is formed over the entire substrate surface (that is, over both the first wiring lines 25 and the second wiring lines 26). This film is then patterned using photolithography to form the resin layer 33 on top of the first wiring lines 25 and to form the resin layer 43 on top of the second wiring lines 26.

The connection terminals 34 and 35 of the first wiring lines 25 are exposed via openings in the patterned resin layer 33, and the connection terminals 44 and 45 of the second wiring lines 26 are exposed via openings in the patterned resin layer 43.

(Division Step)

Next, as shown in FIG. 9(d), the substrate 15 on which the resin layers 33 and 43 are formed is divided along line S. As shown in FIG. 9(e), this divides the substrate 15 into the first wiring substrate 22 and the second wiring substrate 23.

In this way, in the present embodiment the first wiring lines 25 and the second wiring lines 26 can be formed on a large plastic substrate 61 formed on a large glass substrate 60 using conventional methods for manufacturing a liquid crystal display panel or the like. This makes it possible to produce the first wiring substrate 22 and the second wiring substrate 23 at a lower cost and with higher precision than by using commercially available flexible printed circuit boards.

It should be noted that when the division step is performed, the plastic substrate 61 and the protective layer 62 become the plastic substrate 31 and protective layer 32, respectively, of the first wiring substrate 22. Similarly, when the division step is performed, the plastic substrate 61 and the protective layer 62 become the plastic substrate 41 and protective layer 42, respectively, of the second wiring substrate 23.

(Step for Fixing the First Wiring Substrate and the Second Wiring Substrate Together)

Next, as shown in FIG. 10(a), with the first wiring substrate 22 facing down, a conductive adhesive layer 46 is arranged between the connection terminals 35 of the first wiring substrate 22 and the connection terminals 44 of the second wiring substrate 23 such that the connection terminals 35 and the connection terminals 44 are connected together. Furthermore, an adhesive layer 47 is arranged between the resin layer 33 of the first wiring substrate 22 and the resin layer 43 of the second wiring substrate 23, and the second wiring substrate 23 is positioned relative to the first wiring substrate 22.

Next, while the conductive adhesive layer 46 and the adhesive layer 47 are heated to a prescribed curing temperature (180° C., for example), a prescribed pressure force (3 MPa, for example) is applied to the first wiring substrate 22 to compress the conductive adhesive layer 46 and the adhesive layer 47 towards the second wiring substrate 23. This thermally fuses the conductive adhesive layer 46 and the adhesive layer 47 to the surrounding components.

After a prescribed curing time for the conductive adhesive layer 46 and the adhesive layer 47 elapses, the assembly is cooled to connect the connection terminals 35 to the connection terminals 44 via the conductive adhesive layer 46.

This fixes the first wiring substrate 22 and the second wiring substrate 23 together via the conductive adhesive layer 46 and the adhesive layer 47. Moreover, this electrically connects the first wiring substrate 22 and the second wiring substrate 23 to one another via the connection terminals 35 and 44 that are connected via the conductive adhesive layer 46.

Finally, similar to the manner in which the first wiring substrate 22 and the second wiring substrate 23 are fixed together, the second wiring substrate 23 and the third wiring substrate 24 are fixed together via a conductive adhesive layer 54. This electrically connects the second wiring substrate 23 and the third wiring substrate 24 to one another via the connection terminals 45 and 52 that are connected via the conductive adhesive layer 54. Moreover, this creates an assembly in which the first wiring substrate 22, the second wiring substrate 23, and the third wiring substrate 24 are all fixed together.

(Glass Substrate Detachment Step)

Next, the first wiring substrate 22 is irradiated with laser light (excimer laser light, for example) from the glass substrate 60 side to detach the glass substrate 60 from the plastic substrate 31. Next, as shown in FIG. 10(b), a protective film 36 (a polyimide film, for example) for protecting the plastic substrate 31 is applied to the exposed outer surface thereof (that is, to the surface opposite to the side on which the first wiring lines 25 are disposed).

Next, the second wiring substrate 23 is irradiated with laser light (excimer laser light, for example) from the glass substrate 60 side to detach the glass substrate 60 from the plastic substrate 41. Next, as shown in FIG. 10(c), a protective film 49 (a polyimide film, for example) for protecting the plastic substrate 41 is applied to the exposed outer surface thereof (that is, to the surface opposite to the side on which the second wiring lines 26 are disposed).

This completes the wiring substrate 20, which includes the first to third wiring substrates 22 to 24.

<TFT Substrate Formation Process>

First, a glass substrate that is 0.7 mm in thickness, for example, is prepared as a supporting substrate. Next, a film-shaped flexible plastic substrate 6 with a thickness of 20 μm is formed on the glass substrate using a polyimide resin, for example.

Next, the display element layer is formed on the plastic substrate 6 by patterning the TFTs, the pixel electrodes, the gate lines 7 that have the connection terminals 38, the source lines 12, the auxiliary capacitance lines 18 and 29, and the like.

Next, the gate drivers 10 and the source drivers 11 are formed on the driver circuit board 9, thereby forming the driver circuit section T.

Next, the source lines 12 are drawn out into the driver circuit section T and arranged on top of the plastic substrate 13 (which is made from a polyimide resin or the like). The source lines 12 are then connected to the source drivers 11 to complete the TFT substrate 2.

<Color Filter Substrate Formation Process>

First, a glass substrate that is 0.7 mm in thickness, for example, is prepared as a supporting substrate. Next, a film-shaped flexible plastic substrate 8 with a thickness of 20 μm is formed on the glass substrate using a polyimide resin, for example.

Next, the color filter element layer is formed on the plastic substrate 8 by forming the color filter that includes the colored layers and the black matrix and patterning the overcoat layer, the common electrode, and the like. This completes the color filter substrate 3.

<Process for Fixing the TFT Substrate and the Color Filter Substrate Together>

First, a sealing material 5 is formed by using a dispenser to dispense an ultraviolet thermosetting resin or the like in a frame shape around the periphery of the color filter substrate 3, for example.

Next, a liquid crystal material is dripped into the interior region of the sealing material 5 to form the liquid crystal layer 4 on the color filter substrate 3.

The color filter substrate 3 (onto which the liquid crystal material has been dripped) and the TFT substrate 2 are then fixed together using gentle pressure.

Next, the assembly is left in a high air pressure environment to apply pressure to the front and rear surfaces of the assembly. Then, after the sealing material 5 sandwiched between the color filter substrate 3 and the TFT substrate 2 is irradiated with UV light, heat is applied to the assembly to cure the sealing material 5. This completes the initial TFT substrate 2-color filter substrate 3 assembly.

<Glass Substrate Detachment Process>

Next, similar to the manner in which the abovementioned glass substrate 60 is detached, the glass substrates of the TFT substrate 2 and the color filter substrate 3 are irradiated with laser light (excimer laser light, for example) to detach the glass substrates. This completes the liquid crystal display panel 17, which includes the TFT substrate 2 and the color filter substrate.

<Wiring Substrate Attachment Process>

Next, the wiring substrates 20 are attached to the liquid crystal display panel 17. More specifically, first the wiring substrates 20 are arranged such that they sandwich the gate lines 7 that are drawn out from the display region D into the frame regions F of the liquid crystal display panel 17.

When arranging each wiring substrate 20, the first wiring substrate 22 is arranged on the gate line 7 side of the TFT substrate 2, and the second wiring substrate 23 is arranged on the side of the TFT substrate 2 opposite to the gate line 7 side.

Next, a conductive adhesive layer 40 is arranged between the connection terminals 38 of the gate lines 7 that are drawn out from the display region D into the frame regions F and the connection terminals 34 of the first wiring lines 25 such that the connection terminals 34 and the connection terminals 38 are connected together. Furthermore, an adhesive layer 48 is arranged between the plastic substrate 6 of the TFT substrate 2 and the resin layer 43 of the second wiring substrate 23, and the wiring substrate 20 is positioned relative to the TFT substrate 2.

Next, while the conductive adhesive layer 40 and the adhesive layer 48 are heated to a prescribed curing temperature (180° C., for example), a prescribed pressure force (3 MPa, for example) is applied to the first wiring substrate 22 and the second wiring substrate 23 to compress the conductive adhesive layer 40 and the adhesive layer 48 towards the TFT substrate 22. This thermally fuses the conductive adhesive layer 40 and the adhesive layer 48 to the surrounding components.

After a prescribed curing time for the conductive adhesive layer 40 and the adhesive layer 48 elapses, the assembly is cooled to connect the connection terminals 34 to the connection terminals 38 via the conductive adhesive layer 40 and to fix the TFT substrate 2 and the second wiring substrate 23 together via the adhesive layer 48.

Next, the connection terminals 53 of the third wiring lines 27 are connected to the connection terminals of the corresponding gate driver 10 to create an electrical connection therebetween. This electrically connects the gate lines 7 to the first wiring lines 25 via the conductive adhesive layer 40 and the connection terminals 34 and 38, thereby connecting the gate drivers 10 to the gate lines 7 via the first to third wiring lines 25 to 27.

This completes the liquid crystal display device 1 as depicted in FIGS. 1 and 3.

The present embodiment as described above achieves the following effects.

(1) The present embodiment is configured such that the wiring substrates 20 sandwich the gate lines 7 that are drawn out into the frame regions F. Moreover, each wiring substrate 20 includes: a first wiring substrate 22 that is provided on the gate line 7 side of the TFT substrate 2 and has first wiring lines 25 that are connected to the gate lines 7 that are drawn out into the frame region F; a second wiring substrate 23 that is arranged on the side of the TFT substrate 2 opposite to the gate line 7 side and has second wiring lines 26 that are connected to the first wiring lines 25; and a third wiring substrate 24 that is attached to the second wiring substrate 23 and has third wiring lines 27 that are connected to the second wiring lines 26 and the corresponding gate driver 10. In this way, the gate drivers 10 are connected to the gate lines 7 via the first to third wiring lines 25 to 27.

This allows the gate lines 7 that are drawn out into the frame regions F to be sandwiched between the first wiring substrate 22 and the second wiring substrate 23 of each wiring substrate 20. In addition, of the first wiring lines 25, the second wiring lines 26, and the third wiring lines 27, the wiring lines that are equivalent to the abovementioned conventional lead-out wiring lines (that is, the second wiring lines 26) can be arranged on the rear side of the TFT substrate 2. This prevents an undue increase in the area of the frame regions F and facilitates miniaturization the liquid crystal display device 1.

(2) Moreover, in the present embodiment, the first to third wiring substrates 22 to 24 each include a flexible plastic substrate. This makes it possible for the overall display device to be flexible in the liquid crystal display device 1.

(3) Moreover, in the present embodiment the plastic substrates 6, 8, 31, 41, and 51 are made from organic materials such as polyimide resins or acrylic resins. This makes it possible to produce the plastic substrates 6, 8, 31, 41, and 51 using low-cost, general-purpose resin materials.

Embodiment 2

Figure 11:
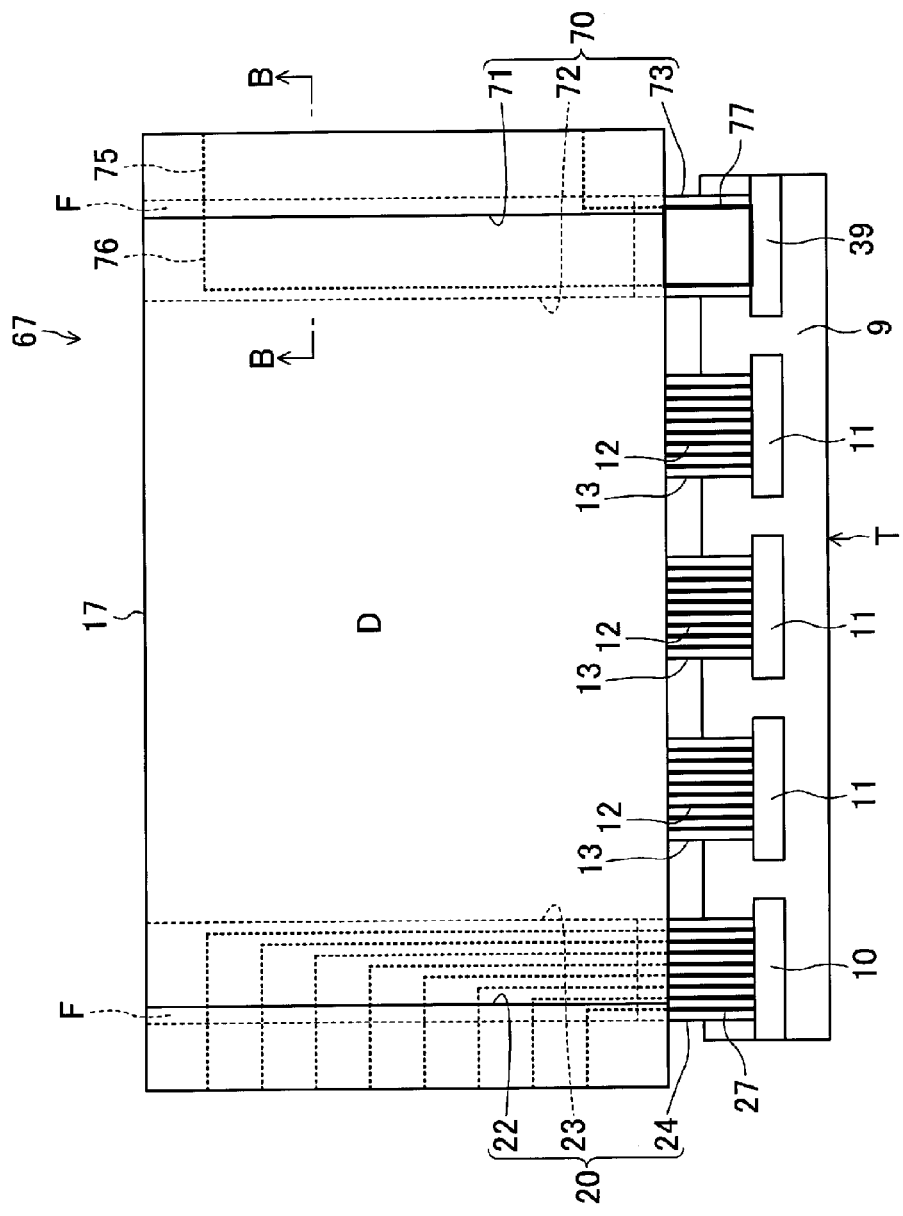
FIG. 11 is a plan view illustrating a liquid crystal display device according to Embodiment 2 of the present invention.
Figure 12:
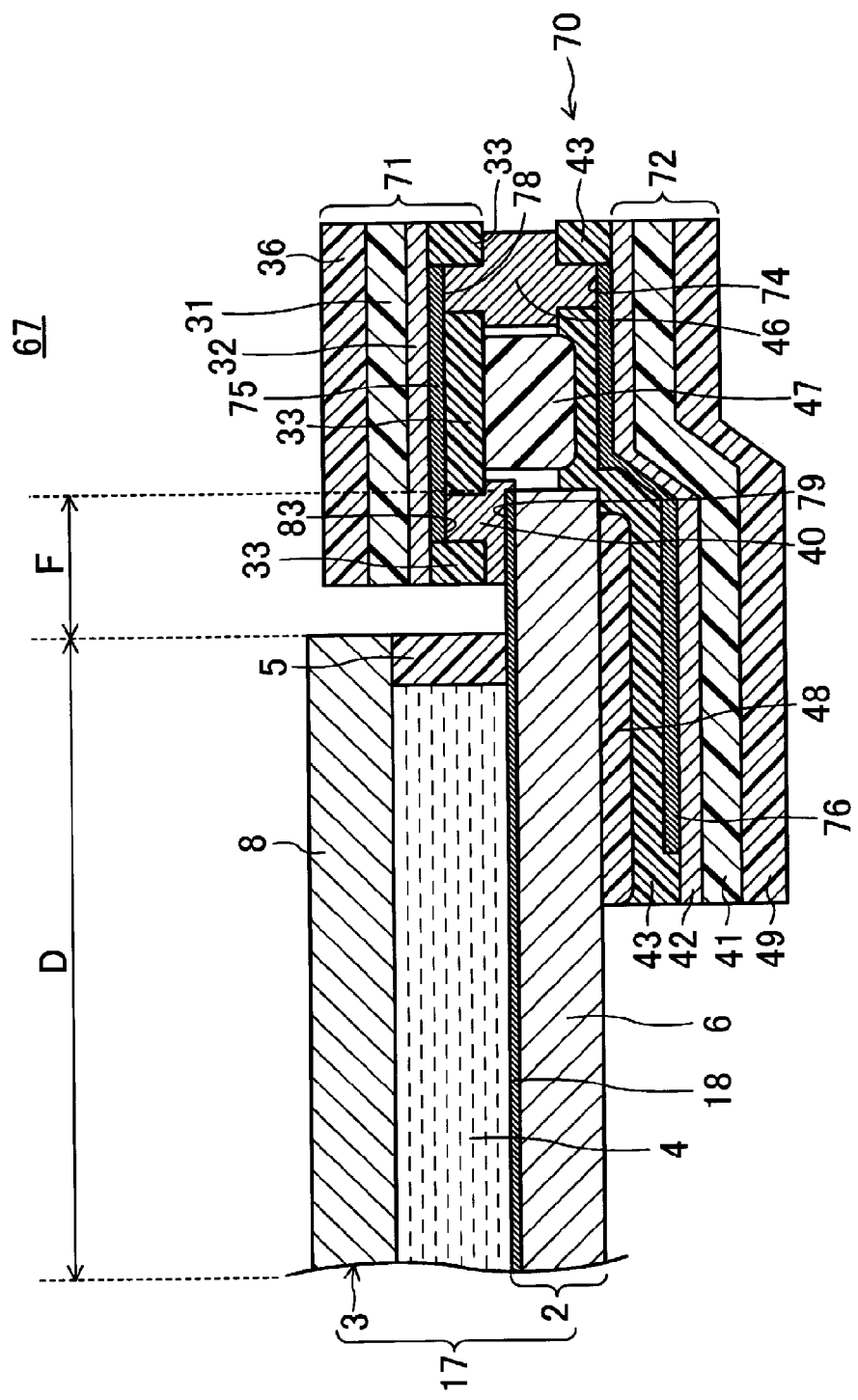
FIG. 12 is a cross-sectional view of the liquid crystal display device according to Embodiment 2 of the present invention taken along line B-B in FIG. 11.
Figure 13:
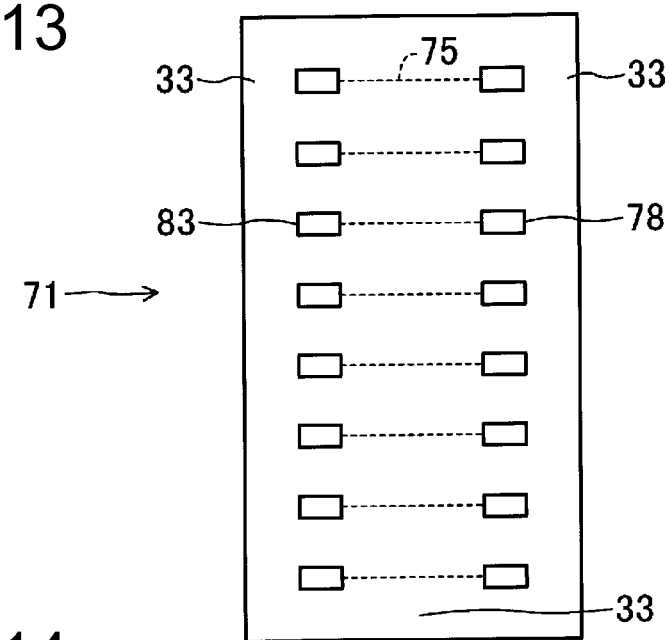
FIG. 13 is a plan view illustrating a first wiring substrate of the liquid crystal display device according to Embodiment 2 of the present invention.
Figure 14:
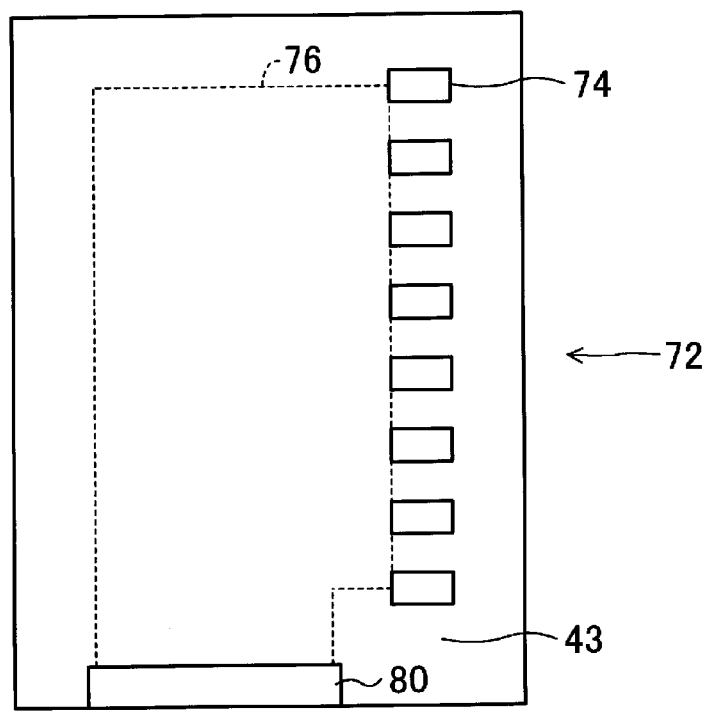
FIG. 14 is a plan view illustrating a second wiring substrate of the liquid crystal display device according to Embodiment 2 of the present invention.
Figure 15:
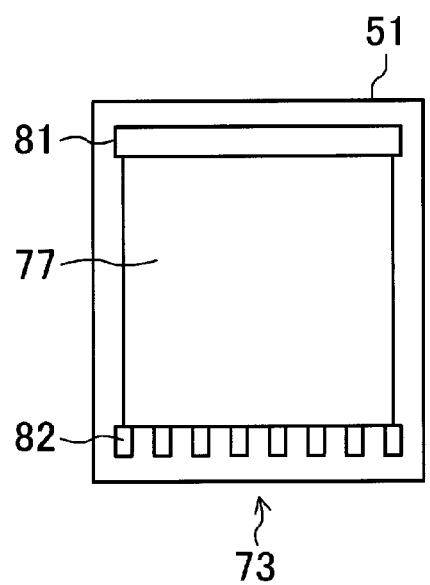
FIG. 15 is a plan view illustrating a third wiring substrate of the liquid crystal display device according to Embodiment 2 of the present invention.
Figure 16:
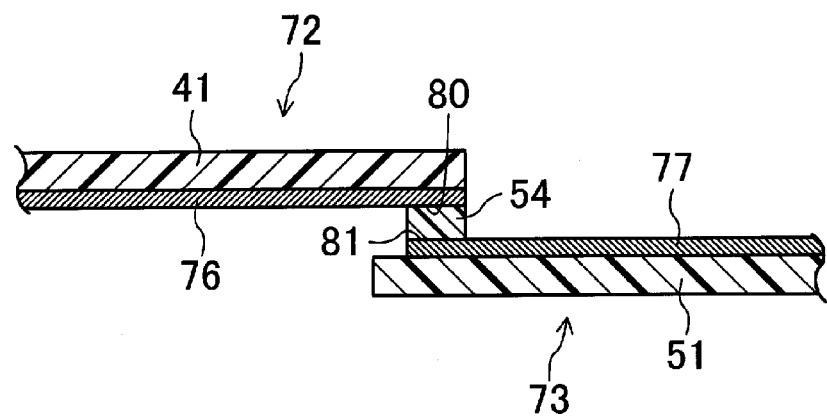
FIG. 16 is a cross-sectional view illustrating how the second wiring substrate and the third wiring substrate are fixed together in the liquid crystal display device according to Embodiment 2 of the present invention.
Figure 17:
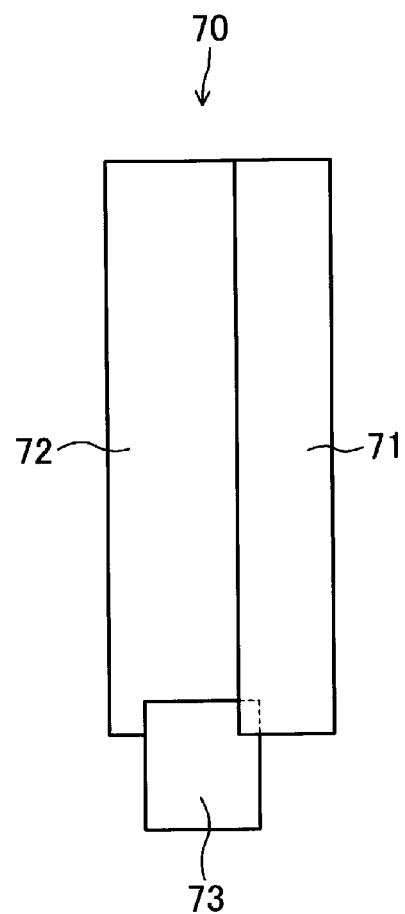
FIG. 17 is a plan view illustrating a wiring substrate of the liquid crystal display device according to Embodiment 2 of the present invention.

Next, Embodiment 2 of the present invention will be described. FIG. 11 is a plan view illustrating a liquid crystal display device according to Embodiment 2 of the present invention. FIG. 12 is a cross-sectional view of the liquid crystal display device according to Embodiment 2 of the present invention taken along line B-B in FIG. 11. Moreover, FIG. 13 is a plan view illustrating a first wiring substrate of the liquid crystal display device according to Embodiment 2 of the present invention. FIG. 14 is a plan view illustrating a second wiring substrate of the liquid crystal display device according to Embodiment 2 of the present invention. Moreover, FIG. 15 is a plan view illustrating a third wiring substrate of the liquid crystal display device according to Embodiment 2 of the present invention. FIG. 16 is a cross-sectional view illustrating how the second wiring substrate and the third wiring substrate are fixed together in the liquid crystal display device according to Embodiment 2 of the present invention. Moreover, FIG. 17 is a plan view illustrating a wiring substrate of the liquid crystal display device according to Embodiment 2 of the present invention. Note that the same reference characters are used for components of the liquid crystal display device that are the same as components used in Embodiment 1, and descriptions of those components are omitted here. Moreover, the methods for manufacturing the wiring substrate and the liquid crystal display device of the present embodiment are the same as the methods used in Embodiment 1, and detailed descriptions of those methods are omitted here.

As shown in FIG. 1, in Embodiment 1, two wiring substrates 20 are provided (one in each frame region F), and the gate lines 7 are connected to the corresponding wiring substrate 20. However, as shown in FIG. 11, in a liquid crystal display device 67 according to the present embodiment, a wiring substrate 70 that is connected to auxiliary capacitance lines 18 is provided in addition to a wiring substrate 20 that is connected to gate lines 7.

More specifically, as shown in FIGS. 11 and 12, the auxiliary capacitance lines 18 are drawn out from the display region D into one of the frame regions F. The wiring substrate 70 is provided in that frame region F and sandwiches the auxiliary capacitance lines 18 that are drawn out thereinto.

The wiring substrate 70 includes: a first wiring substrate 71 that is provided on the auxiliary capacitance line 18 side of a TFT substrate 2 and has first wiring lines 75 that are connected to the auxiliary capacitance lines 18 that are drawn out into the frame region F; a second wiring substrate 72 that is arranged on the side of the TFT substrate 2 opposite to the auxiliary capacitance line 18 side and has second wiring lines 76 that are connected to the first wiring lines 75; and a third wiring substrate 73 that is attached to the second wiring substrate 72 and has third wiring lines 77 that are connected to the second wiring lines 76 and an auxiliary capacitance terminal 39 (that is, to an inverting driver circuit for the auxiliary capacitance lines).

Moreover, the auxiliary capacitance terminal 39 is connected to the auxiliary capacitance lines 18 via the first to third wiring lines 75 to 77. Moreover, the auxiliary capacitance terminal 39 is connected to a driver circuit of the driver circuit section T such as an inverting driver circuit (not shown in the figures) for the auxiliary capacitance lines, for example.

Furthermore, in the present embodiment, the auxiliary capacitance lines 18 that are drawn out into the frame region F are sandwiched between the first wiring substrate 71 and the second wiring substrate 72. Moreover, of the first wiring lines 75, the second wiring lines 76, and the third wiring lines 77, the wiring lines that are equivalent to the auxiliary capacitance line 29 (the lead-out wiring line) described in Embodiment 1 (that is, the second wiring lines 76) are arranged on the rear side of the TFT substrate 2 (that is, on the side opposite to the auxiliary capacitance line 18 side of the TFT substrate 2). As a result, as shown in FIG. 11, a portion of the second wiring substrate 72 on which the second wiring lines 76 are formed overlaps with the display region D when viewed in a plan view.

Therefore, providing the liquid crystal display device 67 with this wiring substrate 70 prevents an undue increase in the area of the frame region F and further facilitates miniaturization the liquid crystal display device 1.

As shown in FIGS. 12 and 13, the first wiring substrate 71 includes: a film-shaped flexible plastic substrate 31 made from a resin material such as a polyimide resin; and a moisture-resistant protective layer 32 formed on the plastic substrate 31. Moreover, the first wiring substrate 71 includes: the first wiring lines 75 that are formed on the protective layer 32 and are connected to the auxiliary capacitance lines 18 and the second wiring lines 76; and a resin layer 33 formed on top of both the protective layer 32 and the first wiring lines 75.

Moreover, as shown in FIGS. 12 and 13, connection terminals 78 and 83 are formed on the ends of the first wiring lines 75. The first wiring substrate 71 is fixed to the TFT substrate 2 via a conductive adhesive layer 40. The conductive adhesive layer 40 also electrically connects the connection terminals 83 to connection terminals 79 formed on the ends of the auxiliary capacitance lines 18, thereby electrically connecting the first wiring lines 75 to the auxiliary capacitance lines 18.

Moreover, as shown in FIGS. 12 and 14, the second wiring substrate 72 includes: a film-shaped flexible plastic substrate 41 made from a resin material such as a polyimide resin; and a moisture-resistant protective layer 42 formed on the plastic substrate 41. Moreover, the second wiring substrate 72 includes: the second wiring lines 76 that are formed on the protective layer 42 and are connected to the first wiring lines 75 and the third wiring lines 77; and a resin layer 43 formed on top of both the protective layer 42 and the second wiring lines 76.

Moreover, as shown in FIGS. 12 and 14, connection terminals 74 and 80 are formed on the ends of the second wiring lines 76. The second wiring substrate 72 is fixed to the first wiring substrate 71 via a conductive adhesive layer 46. The conductive adhesive layer 46 also electrically connects the connection terminals 78 of the first wiring substrate 71 to the connection terminals 74 of the second wiring substrate 72, thereby electrically connecting the first wiring lines 75 to the second wiring lines 76.

As shown in FIGS. 11 and 15, the third wiring substrate 73 includes: a film-shaped flexible plastic substrate 51 made from a resin material such as a polyimide resin; and the third wiring lines 77 that are formed on the plastic substrate 51 and are connected to the second wiring lines 76 and the auxiliary capacitance terminal 39.

Moreover, as shown in FIG. 15, connection terminals 81 and 82 are formed on the ends of the third wiring lines 77. As shown in FIG. 16, the third wiring substrate 73 is fixed to the second wiring substrate 72 via a conductive adhesive layer 54. The conductive adhesive layer 54 also electrically connects the connection terminals 80 of the second wiring substrate 76 to the connection terminals 81 of the third wiring substrate 73, thereby electrically connecting the second wiring lines 76 to the third wiring lines 77.

Moreover, the connection terminals 82 of the third wiring lines 77 are connected to the auxiliary capacitance terminal 39, thereby electrically connecting the third wiring lines 77 to the auxiliary capacitance terminal 39.

Furthermore, in the present embodiment the auxiliary capacitance terminal 39 is connected to the inverting driver circuit. The auxiliary capacitance terminal 39 is also connected to the auxiliary capacitance lines 18 via the first to third wiring lines 75 to 77.

FIG. 17 is a plan view of the wiring substrate 70, which is configured by fixing the first wiring substrate 71 and the third wiring substrate 73 to the second wiring substrate 72.

The present embodiment as described above achieves the following effect in addition to the abovementioned effects (1) to (3).

(4) The present embodiment is configured such that the wiring substrates 70 sandwiches the auxiliary capacitance lines 18 that are drawn out into the frame region F. Moreover, the wiring substrate 70 includes: a first wiring substrate 71 that is provided on the auxiliary capacitance line 18 side of a TFT substrate 2 and has first wiring lines 75 that are connected to the auxiliary capacitance lines 18 that are drawn out into the frame region F; a second wiring substrate 72 that is arranged on the side of the TFT substrate 2 opposite to the auxiliary capacitance line 18 side and has second wiring lines 76 that are connected to the first wiring lines 75; and a third wiring substrate 73 that is attached to the second wiring substrate 72 and has third wiring lines 77 that are connected to the second wiring lines 76 and an auxiliary capacitance terminal 39 (that is, to an inverting driver circuit for the auxiliary capacitance lines). In this way, the auxiliary capacitance terminal (that is, the inverting driver circuit for the auxiliary capacitance lines) is connected to the auxiliary capacitance lines 18 via the first to third wiring lines 75 to 77.

This allows the auxiliary capacitance lines 18 that are drawn out into the frame region F to be sandwiched between the first wiring substrate 71 and the second wiring substrate 72. Also, of the first wiring lines 75, the second wiring lines 76, and the third wiring lines 77, the wiring lines that are equivalent to the auxiliary capacitance line 29 (lead-out wiring line) (that is, the second wiring lines 76) can be arranged on the rear side of the TFT substrate 2. This prevents an undue increase in the area of the frame region F and further facilitates miniaturization the liquid crystal display device 67.

Embodiment 3

Figure 18:
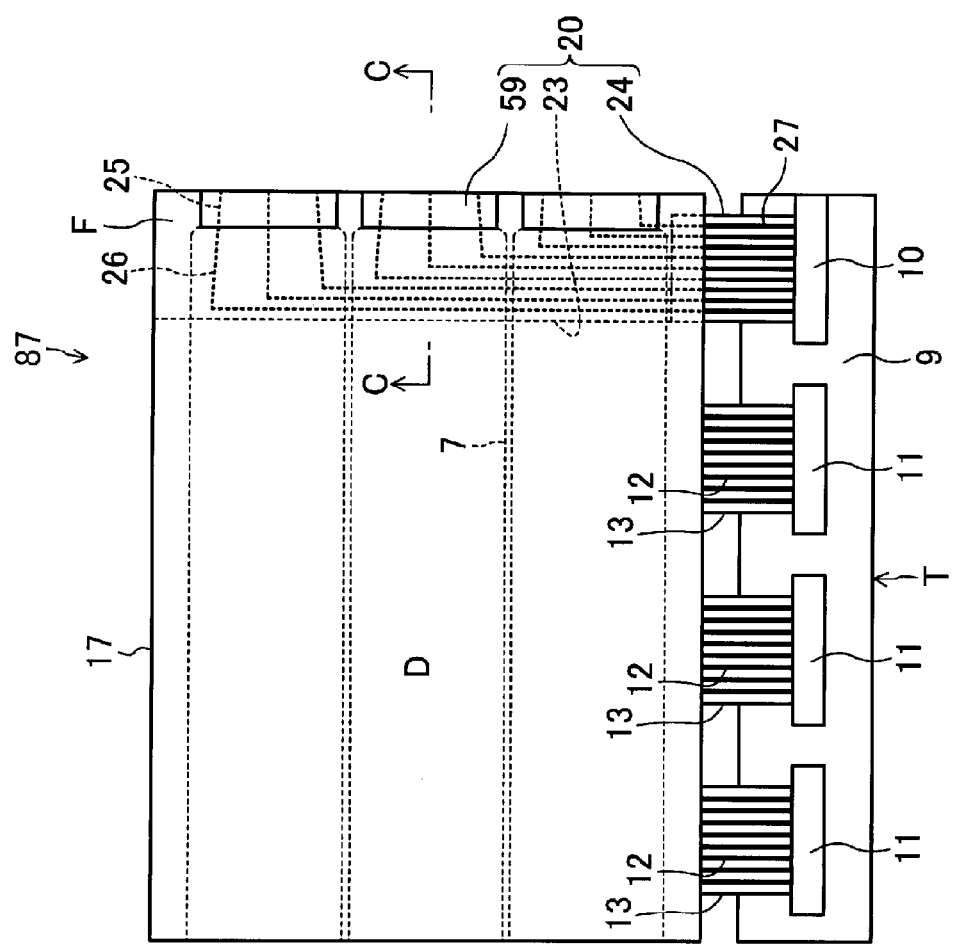
FIG. 18 is a plan view illustrating a liquid crystal display device according to Embodiment 3 of the present invention.
Figure 19:
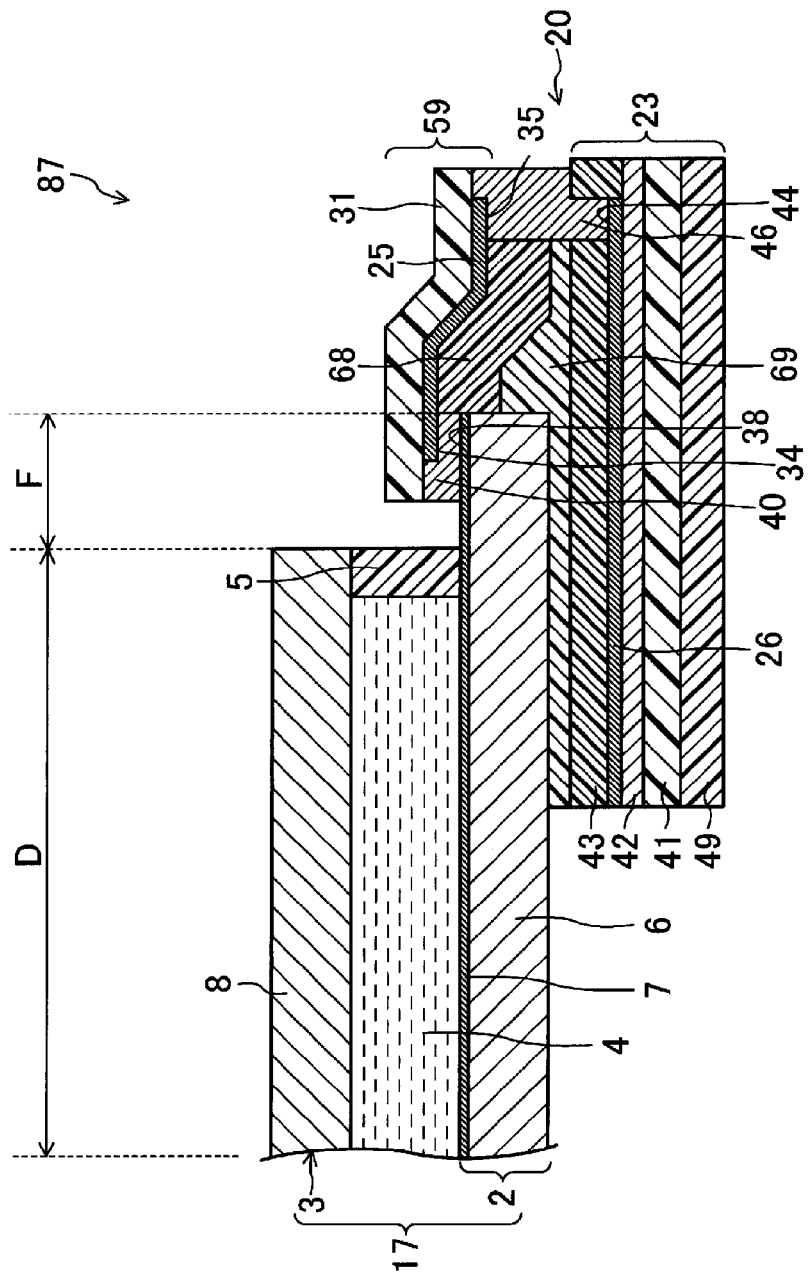
FIG. 19 is a cross-sectional view of the liquid crystal display device according to Embodiment 3 of the present invention taken along line C-C in FIG. 18.
Figure 20:
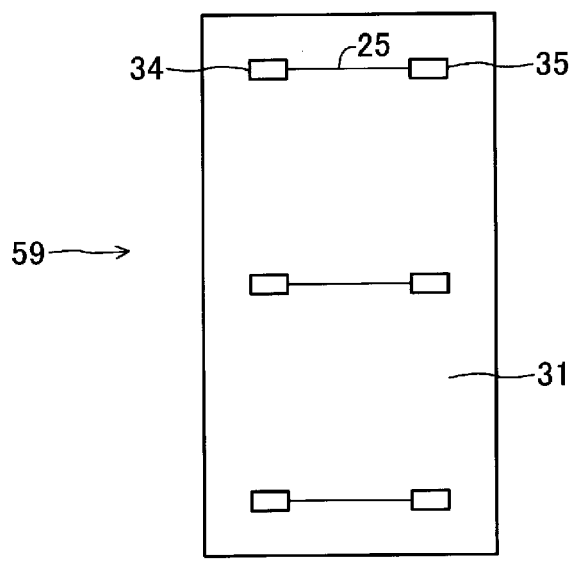
FIG. 20 is a plan view illustrating a first wiring substrate of the liquid crystal display device according to Embodiment 3 of the present invention.
Figure 21:
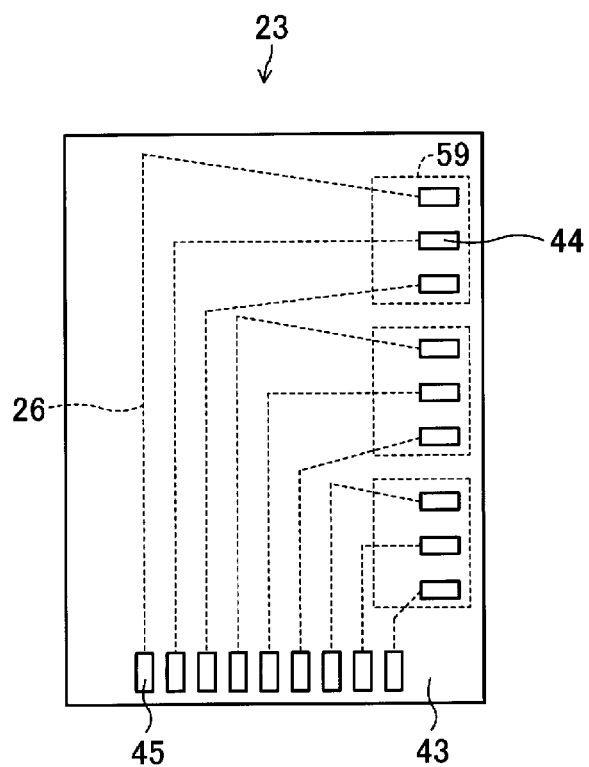
FIG. 21 is a plan view illustrating a second wiring substrate of the liquid crystal display device according to Embodiment 3 of the present invention.
Figure 22:
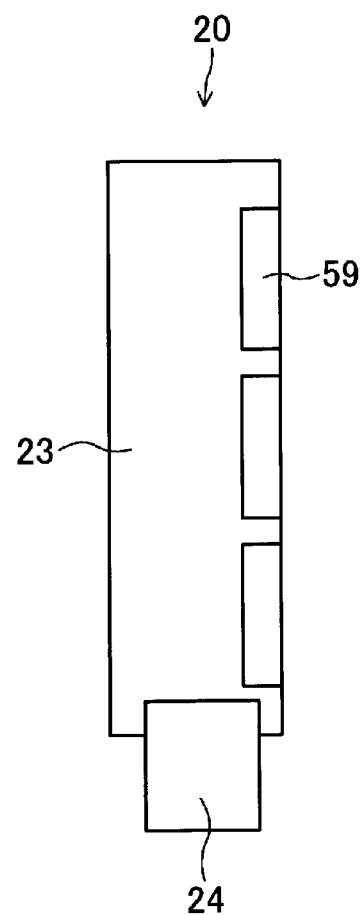
FIG. 22 is a plan view illustrating a wiring substrate of the liquid crystal display device according to Embodiment 3 of the present invention.

Next, Embodiment 3 of the present invention will be described. FIG. 18 is a plan view illustrating a liquid crystal display device according to Embodiment 3 of the present invention. FIG. 19 is a cross-sectional view of the liquid crystal display device according to Embodiment 3 of the present invention taken along line C-C in FIG. 18. Moreover, FIG. 20 is a plan view illustrating a first wiring substrate of the liquid crystal display device according to Embodiment 3 of the present invention. FIG. 21 is a plan view illustrating a second wiring substrate of the liquid crystal display device according to Embodiment 3 of the present invention. Moreover, FIG. 22 is a plan view illustrating a wiring substrate of the liquid crystal display device according to Embodiment 3 of the present invention. Note that the same reference characters are used for components of the liquid crystal display device that are the same as components used in Embodiment 1, and descriptions of those components are omitted here.

As shown in FIGS. 18 and 19, in a liquid crystal display device 87 according to the present embodiment, the first wiring substrate 22 of Embodiment 1 is replaced with a first wiring substrate 59. The first wiring substrate 59 is a flexible printed circuit board that includes: a film-shaped flexible plastic substrate 31 made from a resin material such as a polyimide resin; and first wiring lines 25 that are formed on the plastic substrate 31 and are connected to second wiring lines 26 and gate lines 7.

With this configuration, a commercially available flexible printed circuit board can be used for the first wiring substrate 22. This removes the need for a step for detaching the glass substrate 60 after forming the plastic substrate 31 thereon during the method for manufacturing the wiring substrate described in Embodiment 1, thereby simplifying the overall manufacturing process.

Moreover, because the plastic substrate 31 is flexible, the wiring substrate 59 can be deformed during the abovementioned process for attaching the wiring substrates to the liquid crystal display panel. Therefore, after arranging a wiring substrate 20 such that the wiring substrate 20 sandwiches the gate lines 7 that are drawn out from a display region D into a frame region F and then attaching the wiring substrate 20 to a liquid crystal display panel 17, a glass substrate 60 can be detached from a second wiring substrate 23. This simplifies the overall process for attaching the wiring substrate 20 to the liquid crystal display panel 17.

As shown in FIGS. 19 and 20, connection terminals 34 and 35 are formed on the ends of the first wiring lines 25 of the first wiring substrate 59. The first wiring substrate 59 is fixed to a TFT substrate 2 via a conductive adhesive layer 40. The conductive adhesive layer 40 also electrically connects the connection terminals 34 to connection terminals 38 formed on the ends of the gate lines 7, thereby electrically connecting the first wiring lines 25 to the gate lines 7.

The first wiring substrate 59 also includes a coverlay 68 formed on top of the first wiring line 25. The coverlay 68 is made from an insulating inorganic material such as a silicon nitride film, a silicon oxide film, a silicon oxide nitride film, or a silicon nitride oxide film, for example.

Moreover, as shown in FIGS. 18 and 21, connection terminals 44 and 45 are formed on the ends of the second wiring lines 26 of the second wiring substrate 23. The second wiring substrate 23 is fixed to the first wiring substrate 59 via a conductive adhesive layer 46. The conductive adhesive layer 46 also electrically connects the connection terminals 35 of the first wiring substrate 59 to the connection terminals 44 of the second wiring substrate 23, thereby electrically connecting the first wiring lines 25 to the second wiring lines 26.

Moreover, as shown in FIG. 19, the wiring substrate 20 includes an adhesive layer 69 that is sandwiched between the first wiring lines 25 of the first wiring substrate 59 and a resin layer 43 of the second wiring substrate 23. This adhesive layer 69 fixes the first wiring substrate 59 and the second wiring substrate 23 together.

Moreover, as shown in FIG. 19, the adhesive layer 69 is also sandwiched between a plastic substrate 6 of the TFT substrate 2 and the resin layer 43 of the second wiring substrate 23. This adhesive layer 69 fixes the plastic substrate 6 and the second wiring substrate 23 together.

The adhesive layer 69 is formed using the abovementioned thermosetting resin such as an epoxy resin. Furthermore, the adhesive layer 69 fixes the first wiring substrate 59 and the second wiring substrate 23 together.

Moreover, as shown in FIGS. 18 and 21, in the present embodiment a portion of each of the plurality of second wiring lines 26 formed on the second wiring substrate 23 is bent such that those portions extend towards the first wiring substrate 59 that is attached to the second wiring substrate 23.

Similarly, as shown in FIG. 18, a portion of each of the plurality of gate lines 7 formed on the TFT substrate 2 is bent such that those portions extend towards the first wiring substrate 59.

This configuration makes it possible to group together the gate lines 7 and the second wiring lines 26 that will be connected to the first wiring lines 25 such that the gate lines 7 and the second wiring lines 26 run towards the first wiring substrate 59. This, in turn, makes it possible to reduce the area of the connection portions between the gate lines 7 and the first wiring lines 25 and the area of the connection portions between the first wiring lines 25 and the second wiring lines 26. Therefore, the overall area of the first wiring substrate 59 can be reduced. This makes it possible to keep manufacturing costs down even when using a higher-cost, commercially available flexible printed circuit board for the first wiring substrate 59.

Moreover, in the present embodiment the wiring substrate shown in FIG. 6 can be used as a third wiring substrate 24. The third wiring substrate 24 can be connected to the second wiring substrate 23 as shown in FIG. 7.

FIG. 22 is a plan view of the wiring substrate 20, which is configured by fixing the first wiring substrate 59 and the third wiring substrate 24 to the second wiring substrate 23.

Figure 23:
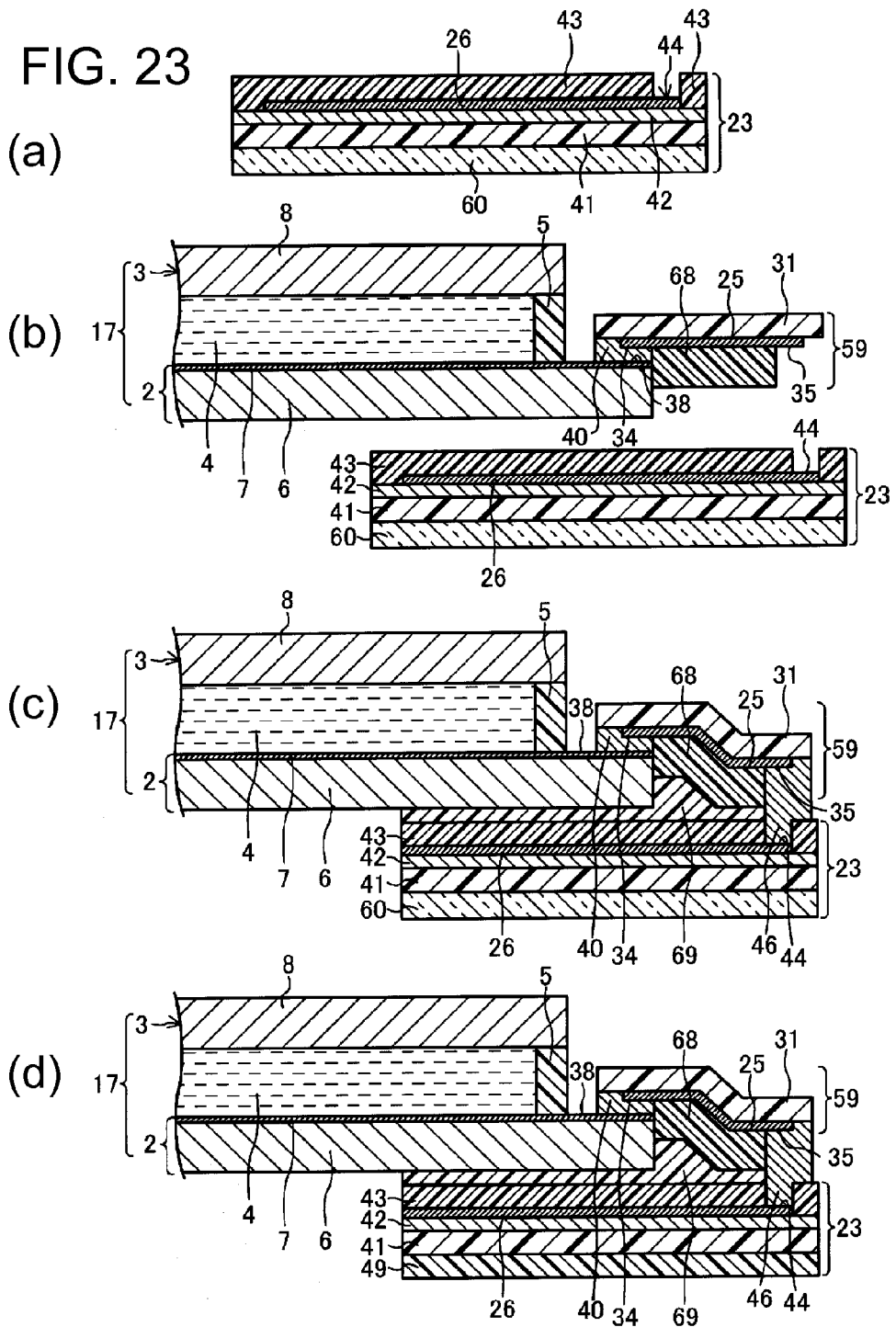
FIG. 23 is a cross-sectional view for explaining a method for manufacturing the liquid crystal display device according to Embodiment 3 of the present invention.

Next, a method for manufacturing the wiring substrates and the liquid crystal display device of the present embodiment will be described. FIG. 23 is a cross-sectional view for explaining the method for manufacturing the liquid crystal display device according to Embodiment 3 of the present invention. It should be noted that the method described below is only an example. The liquid crystal display device of the present invention is not limited to being manufactured using the method described below.

<Wiring Substrate Formation Process>

Like in Embodiment 1, the process for forming the wiring substrates of the present embodiment includes: a plastic substrate formation step, a protective layer formation step, a wiring line formation step, a resin layer formation step, and a division step. Completing these steps produces the second wiring substrate 23, to which the glass substrate 60 and the third wiring substrate 24 are attached, as shown in FIG. 23(*a*).

(First Wiring Substrate Attachment Process)

Next, the first wiring substrate 59 is prepared. The first wiring substrate 59 is a commercially available flexible printed circuit board that includes: the film-shaped flexible plastic substrate 31 made from a resin material such as a polyimide resin; and the first wiring lines 25 that are formed on the plastic substrate 31. Next, as shown in FIG. 23(*b*), with the first wiring substrate 59 facing down, the first wiring substrate 59 is positioned on the liquid crystal display panel 17 by arranging a conductive adhesive layer 40 between the connection terminals 34 of the first wiring lines 25 of the first wiring substrate 59 and the connection terminals 38 of the gate lines 7 such that the connection terminals 34 and the connection terminals 38 are connected together.

Next, while the conductive adhesive layer 40 is heated to a prescribed curing temperature (180° C., for example), a prescribed pressure force (3 MPa, for example) is applied to the first wiring substrate 59 to compress the conductive adhesive layer 40 towards the liquid crystal display panel 17. This thermally fuses the conductive adhesive layer 40 to the surrounding components.

After a prescribed curing time for the conductive adhesive layer 40 elapses, the assembly is cooled to connect the connection terminals 34 to the connection terminals 38 via the conductive adhesive layer 40.

This fixes the first wiring substrate 59 and the liquid crystal display panel 17 together via the conductive adhesive layer 40. Moreover, this electrically connects the gate lines 7 to the first wiring line 25 via the conductive adhesive layer 40 and the connection terminals 34 and 38, thereby electrically connecting the first wiring substrate 59 to the liquid crystal display panel 17.

(Second Wiring Substrate Attachment Process)

Next, the second wiring substrate 23 is attached to the first wiring substrate 59 and the liquid crystal display panel 17. More specifically, as shown in FIG. 23(*b*), first the second wiring substrate 23 (to which the glass substrate 60 is still attached) is arranged such that the gate lines 7 that are drawn out from the display region D into the frame region F of the liquid crystal display panel 17 are sandwiched between the first wiring substrate 59 and the second wiring substrate 23.

The first wiring substrate 59 is arranged on the gate line 7 side of the TFT substrate 2, and the second wiring substrate 23 is arranged on the side of the TFT substrate 2 opposite to the gate line 7 side.

Next, a conductive adhesive layer 46 is arranged between the connection terminals 35 of the first wiring lines 25 of the first wiring substrate 59 and the connection terminals 44 of the second wiring lines 26 of the second wiring substrate 23 such that the connection terminals 35 and the connection terminals 44 are connected together. Furthermore, an adhesive layer 69 is arranged between the coverlay 68 formed over the first wiring lines 25 and the resin layer 43 of the second wiring substrate 23 as well as between the plastic substrate 6 of the TFT substrate 2 and the resin layer 43 of the second wiring substrate 23. The second wiring substrate 23 is then positioned relative to the first wiring substrate 59 and the TFT substrate 2.

Next, while the conductive adhesive layer 46 and the adhesive layer 69 are heated to a prescribed curing temperature (180° C., for example), a prescribed pressure force (3 MPa, for example) is applied to the second wiring substrate 23 to compress the conductive adhesive layer 46 and the adhesive layer 69 towards the first wiring substrate 59 and the liquid crystal display panel 17. This thermally fuses the conductive adhesive layer 46 and the adhesive layer 69 to the surrounding components.

After a prescribed curing time for the conductive adhesive layer 46 and the adhesive layer 69 elapses, the assembly is cooled to connect the connection terminals 35 to the connection terminals 44 via the conductive adhesive layer 46.

As shown in FIG. 23(*c*), this fixes the first wiring substrate 59 and the second wiring substrate 23 together via the conductive adhesive layer 46 and the adhesive layer 69. Moreover, this electrically connects the first wiring lines 25 and the second wiring lines 26 via the conductive adhesive layer 46 and the connection terminals 35 and 44, thereby electrically connecting the first wiring substrate 59 to the second wiring substrate 23.

Moreover, as shown in FIG. 23(*c*), this fixes the second wiring substrate 23 and the liquid crystal display panel 17 together via the adhesive layer 69.

Next, the connection terminals 53 of the third wiring lines 27 are connected to the connection terminals (not shown in the figures) of the gate driver 10 to create an electrical connection therebetween. This electrically connects the gate driver 10 to the gate lines 7 via the first to third wiring lines 25 to 27.

(Glass Substrate Detachment Step)

Next, the second wiring substrate 23 is irradiated with laser light (excimer laser light, for example) from the glass substrate 60 side to detach the glass substrate 60 from the plastic substrate 41. Next, as shown in FIG. 23(*d*), a protective film 49 (a polyimide film, for example) for protecting the plastic substrate 41 is applied to the exposed outer surface thereof (that is, to the surface opposite to the side on which the second wiring lines 26 are disposed).

This completes the liquid crystal display device 87, which includes the wiring substrate 20 that includes the first wiring substrate 59, the second wiring substrate 23, and the third wiring substrate 24.

The present embodiment as described above achieves the following effect in addition to the abovementioned effects (1) to (3).

(5) In the present embodiment, a portion of each of the plurality of second wiring lines 26 formed on the second wiring substrate 23 is bent such that those portions extend towards the first wiring substrate 59 that is attached to the second wiring substrate 23. Moreover, a portion of each of the plurality of gate lines 7 formed on the TFT substrate 2 is bent such that those portions extend towards the first wiring substrate 59.

This makes it possible to group together the gate lines 7 and the second wiring lines 26 that will be connected to the first wiring lines 25 such that the gate lines 7 and the second wiring lines 26 run towards the first wiring substrate 59. This, in turn, makes it possible to reduce the area of the connection portions between the gate lines 7 and the first wiring lines 25 and the area of the connection portions between the first wiring lines 25 and the second wiring lines 26. Therefore, the overall area of the first wiring substrate 59 can be reduced. This makes it possible to keep manufacturing costs down even when using a higher-cost, commercially available flexible printed circuit board for the first wiring substrate 59.

It should be noted that the following change may be made to the embodiments described above.

In the embodiments described above, a liquid crystal display is used in the display device as an example. However, another type of display such as an organic electroluminescent display, an electrophoretic display, a plasma display (PD), a plasma addressed liquid crystal display (PALC), an inorganic electroluminescent display, a field emission display (FED), a surface-conduction electron-emitter display (SED), or the like may be used in the display device.

INDUSTRIAL APPLICABILITY

As described above, the present invention is particularly suited to application in a display device such as a liquid crystal display device provided with plastic substrates.

DESCRIPTION OF REFERENCE CHARACTERS 1 liquid crystal display device (display device)
2 TFT substrate (display device substrate)
3 color filter substrate (other display device substrate)
4 liquid crystal layer (display medium layer)
6 plastic substrate
7 gate line (driver wiring line)
8 plastic substrate
9 driver circuit board
10 gate driver (driver circuit)
11 source driver
12 source line
17 liquid crystal display panel
18 auxiliary capacitance line
19 TFT
20 wiring substrate
22 first wiring substrate
23 second wiring substrate
24 third wiring substrate
25 first wiring line
26 second wiring line
27 third wiring line
29 auxiliary capacitance line (driver wiring line)
31 plastic substrate (other plastic substrate)
34 connection terminal
35 connection terminal
38 connection terminal
39 auxiliary capacitance terminal
40 conductive adhesive layer
41 plastic substrate (other plastic substrate)
44 connection terminal
45 connection terminal
46 conductive adhesive layer
47 adhesive layer
48 adhesive layer
51 plastic substrate (other plastic substrate)
52 connection terminal
53 connection terminal
54 conductive adhesive layer
59 first wiring substrate
60 glass substrate
61 plastic substrate
67 liquid crystal display device (display device)
68 coverlay
69 adhesive layer
70 wiring substrate
71 first wiring substrate
72 second wiring substrate
73 third wiring substrate
74 connection terminal
75 first wiring line
76 second wiring line
77 third wiring line
78 connection terminal
79 connection terminal
80 connection terminal
81 connection terminal
82 connection terminal
83 connection terminal
87 liquid crystal display device
D display region
F frame region
T driver circuit section

What is claimed is:

1. A display device, comprising:
a display device substrate that is a flexible plastic substrate having driver wiring lines formed thereon, a display region for displaying an image, and a frame region along a periphery of said display region; and
a driver circuit unit that is adjacent to said display region and said frame region and that has a driver circuit connected to said driver wiring lines;
wherein said driver wiring lines are drawn out from the display region to the frame region,
wherein the frame region has a wiring substrate on the display device substrate sandwiching the driver wiring lines that are drawn out on the frame region,
wherein said wiring substrate comprises:
a first wiring substrate that is provided on a side of the display device substrate facing the driver wiring lines and that has first wiring lines connected to the driver wiring lines drawn out on the frame region;
a second wiring substrate that is provided on a side opposite to the side of the display device substrate facing the driver wiring lines and that has second wiring lines connected to the first wiring lines; and
a third wiring substrate that is attached to the second wiring substrate and that has third wiring lines connected to the second wiring lines and the driver circuit,
wherein the first to third wiring substrates are other flexible plastic substrates, and
wherein the driver circuit is connected to the driver wiring lines via the first to third wiring lines.

2. The display device according to claim 1, wherein the driver wiring lines are gate wiring lines.

3. The display device according to claim 1, wherein the driver wiring lines are auxiliary capacitance lines.

4. The display device according to claim 1, wherein the plastic substrate and the other plastic substrates are respectively formed of at least one of a polyimide resin and an acrylic resin.

5. The display device according to claim 1, further comprising:
an opposing substrate that faces the display device substrate; and
a display medium layer sandwiched between the display device substrate and the opposing substrate.

6. The display device according to claim 2, wherein the plastic substrate and the other plastic substrates are respectively formed of at least one of a polyimide resin and an acrylic resin.

7. The display device according to claim 3, wherein the plastic substrate and the other plastic substrates are respectively formed of at least one of a polyimide resin and an acrylic resin.

8. The display device according to claim 2, further comprising:
   an opposing substrate that faces the display device substrate; and
   a display medium layer sandwiched between the display device substrate and the opposing substrate.

9. The display device according to claim 3, further comprising:
   an opposing substrate that faces the display device substrate; and
   a display medium layer sandwiched between the display device substrate and the opposing substrate.

10. The display device according to claim 4, further comprising:
   an opposing substrate that faces the display device substrate; and
   a display medium layer sandwiched between the display device substrate and the opposing substrate.

11. The display device according to claim 6, further comprising:
   an opposing substrate that faces the display device substrate; and
   a display medium layer sandwiched between the display device substrate and the opposing substrate.

12. The display device according to claim 7, further comprising:
   an opposing substrate that faces the display device substrate; and
   a display medium layer sandwiched between the display device substrate and the opposing substrate.

13. The display device according to claim 1, wherein the display device is an organic electroluminescent display.

* * * * *